United States Patent
Choi et al.

(10) Patent No.: US 8,580,648 B2
(45) Date of Patent: Nov. 12, 2013

(54) CAPACITOR HAVING AN ELECTRODE STRUCTURE, METHOD OF MANUFACTURING A CAPACITOR HAVING AN ELECTRODE STRUCTURE AND SEMICONDUCTOR DEVICE HAVING AN ELECTRODE STRUCTURE

(75) Inventors: Suk-Hun Choi, Suwon-si (KR); Kyung-Hyun Kim, Seoul (KR); Chang-Sup Mun, Suwon-si (KR); Sung-Jun Kim, Hwaseong-si (KR); Jin-I Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 303 days.

(21) Appl. No.: 13/035,342

(22) Filed: Feb. 25, 2011

(65) Prior Publication Data
US 2011/0204427 A1    Aug. 25, 2011

(30) Foreign Application Priority Data
Feb. 25, 2010   (KR) .................. 10-2010-0017134

(51) Int. Cl.
*H01L 29/92*    (2006.01)
(52) U.S. Cl.
USPC .............. 438/396; 257/308; 257/E29.343; 257/E21.647; 361/311; 438/397
(58) Field of Classification Search
USPC ................ 257/306–308, 758–760, E29.342, 257/E29.343, E21.647; 438/396, 397; 361/311
See application file for complete search history.

(56) References Cited

U.S. PATENT DOCUMENTS

| | | | | |
|---|---|---|---|---|
| 6,365,453 B1 * | 4/2002 | Deboer et al. | ............... | 438/253 |
| 6,576,941 B1 * | 6/2003 | Lee et al. | ............ | 257/295 |
| 6,617,248 B1 * | 9/2003 | Yang | ............... | 438/686 |
| 6,670,238 B2 * | 12/2003 | Deboer et al. | ............... | 438/255 |
| 6,780,758 B1 * | 8/2004 | Derderian et al. | ............ | 438/630 |
| 6,903,398 B2 * | 6/2005 | Yamamoto | ................ | 257/295 |
| 7,452,783 B2 * | 11/2008 | Cho et al. | ............. | 438/396 |
| 8,124,978 B2 * | 2/2012 | Kim et al. | ............. | 257/71 |
| 2001/0029113 A1 * | 10/2001 | Kunitomo et al. | ............ | 438/785 |
| 2002/0008270 A1 * | 1/2002 | Marsh | ............. | 257/306 |
| 2003/0013252 A1 * | 1/2003 | Hwang et al. | ............ | 438/255 |
| 2008/0210999 A1 * | 9/2008 | Horikawa | ............ | 257/296 |
| 2010/0117194 A1 * | 5/2010 | Chung et al. | ............ | 257/532 |
| 2010/0267215 A1 * | 10/2010 | Park | ............ | 438/397 |

FOREIGN PATENT DOCUMENTS

| | | |
|---|---|---|
| KR | 1020030069751 A | 8/2003 |
| KR | 1020060000907 A | 1/2006 |
| KR | 1020060077652 A | 7/2006 |

* cited by examiner

*Primary Examiner* — Allan R Wilson
(74) *Attorney, Agent, or Firm* — Myers Bigel Sibley & Sajovec, P.A.

(57) ABSTRACT

A capacitor includes an object or a substrate including an insulation layer having an opening, an electrode structure having conductive patterns, a dielectric layer and an upper electrode. The electrode structure may have a first conductive pattern including metal and a second conductive pattern including metal oxide generated from the first conductive pattern. The first conductive pattern may fill the opening and may protrude over the insulation layer. The second conductive pattern may extend from the first conductive pattern. The electrode structure may additionally include a third conductive pattern disposed on the second conductive pattern. The capacitor including the electrode structure may ensure improved structural stability and electrical characteristics.

2 Claims, 25 Drawing Sheets

40

CAPACITOR HAVING AN ELECTRODE STRUCTURE, METHOD OF MANUFACTURING A CAPACITOR HAVING AN ELECTRODE STRUCTURE AND SEMICONDUCTOR DEVICE HAVING AN ELECTRODE STRUCTURE

CLAIM OF PRIORITY

This application claims priority under 35 USC §119 to Korean Patent Application No. 2010-17134, filed on Feb. 25, 2010 in the Korean Intellectual Property Office (KIPO), the contents of which are herein incorporated by reference in their entirety.

BACKGROUND

1. Field

Example embodiments of the inventive concept relate to a capacitor having an electrode structure, a method of manufacturing a capacitor having an electrode structure, and a semiconductor device having an electrode structure. More particularly, example embodiments of the inventive concept relate to a capacitor having an electrode structure including conductive patterns containing metal and metal oxide, a method of manufacturing the capacitor and a semiconductor device having the electrode structure.

2. Description of the Related Art

As semiconductor memory devices become more highly integrated, sizes of conductive patterns of the semiconductor memory device become minute while increasing desired storage capacity of the semiconductor memory device. To compensate for a reduced area of a storage electrode in a capacitor, a height of the capacitor may increase, such that the storage electrode may have a greatly increased aspect ratio.

When the capacitor in the semiconductor memory device has a high aspect ratio, the capacitor may frequently collapse or adjacent capacitors may contact each other. Considering such problem, a lower electrode of a capacitor has been formed by performing several photo processes and etching processes. However, additional photolithography processes may cause complexity in the manufacturing processes for the semiconductor memory device and increased manufacturing cost for the semiconductor memory device. Further, process margins for the semiconductor memory device may not be sufficiently ensured when the capacitor is obtained by a plurality of photolithography processes.

SUMMARY

Example embodiments of the inventive concept provide a capacitor having an electrode structure that includes an electrode pattern containing metal and an electrode pattern metal oxide.

Example embodiments of the inventive concept provide a method of manufacturing a capacitor having an electrode structure that includes an electrode pattern containing metal and an electrode pattern containing metal oxide.

Example embodiments of the inventive concept provide a semiconductor device having an electrode structure that includes an electrode pattern containing metal and an electrode pattern containing metal oxide.

According to example embodiments of the inventive concept, there is provided a capacitor including an object, an electrode structure, a dielectric layer and an upper electrode. The object may include an insulation layer having an opening. The electrode structure may have a first conductive pattern including metal and a second conductive pattern including metal oxide generated from the first conductive pattern. The first conductive pattern may fill the opening and may protrude over the insulation layer. The second conductive pattern may extend from the first conductive pattern. The dielectric layer may be disposed on the electrode structure and the upper electrode may be disposed on the dielectric layer.

In example embodiments of the inventive concept, the first conductive pattern may include tungsten, ruthenium and/or indium, and the second conductive pattern may include tungsten oxide, ruthenium oxide and/or indium oxide.

In example embodiments of the inventive concept, the second conductive pattern may be integrally formed with the first conductive pattern.

In example embodiments of the inventive concept, the first conductive pattern may have a cross section substantially the same as a cross section of the second conductive pattern.

In example embodiments of the inventive concept, the first conductive pattern may have a convex upper face.

In example embodiments of the inventive concept, the second conductive pattern may extend from an upper peripheral portion of the first conductive pattern in a direction substantially perpendicular to the object.

In example embodiments of the inventive concept, the first conductive pattern may have a concave upper face. Here, the second conductive pattern may have a circular cylinder shape, an elliptical cylinder shape or a polygonal cylinder shape. A lower portion of the second conductive pattern may be partially buried in the first conductive pattern.

According to example embodiments of the inventive concept, there is provided a capacitor including a substrate, an electrode structure, a dielectric layer and an upper electrode. The substrate may include an insulation layer. The electrode structure may have a first conductive pattern including metal, a second conductive pattern including metal oxide, and a third conductive pattern disposed on the second conductive pattern. The first conductive pattern may be buried in the insulation layer. The second conductive pattern may extend from the first conductive pattern. The dielectric layer may be disposed on the second and the third conductive patterns. The upper electrode may be disposed on the dielectric layer.

In example embodiments of the inventive concept, the first conductive pattern may have a cross section substantially the same as a cross section of the second conductive pattern.

In example embodiments of the inventive concept, the third conductive pattern may have a circular pillar shape, an elliptical pillar shape, a polygonal pillar shape, a circular cylinder shape, an elliptical cylinder shape or a polygonal cylinder shape. Here, an upper portion of the third conductive pattern may have a width substantially greater than that of a lower portion of the third conductive pattern. The width of the lower portion of the third conductive pattern may be substantially the same as or substantially less than a width of the second conductive pattern.

In example embodiments of the inventive concept, the third conductive pattern may include metal substantially the same as the metal in the first conductive pattern.

In example embodiments of the inventive concept, the third conductive pattern may include metal, metal compound and/or polysilicon.

In example embodiments of the inventive concept, the capacitor may further include a supporting member disposed between adjacent elements of the third conductive pattern.

According to example embodiments of the inventive concept, there is provided a capacitor include a substrate having an insulation layer, an electrode structure, a dielectric layer and an upper electrode disposed on the dielectric layer. The electrode structure may have a first conductive pattern including metal, a second conductive pattern disposed on the first conductive pattern, and a third conductive pattern extending from the second conductive pattern. The first conductive pattern may be buried in the insulation layer and including metal. The third conductive pattern may be integrally formed with the second conductive pattern. The dielectric layer may be disposed on the second and the third conductive patterns.

In example embodiments of the inventive concept, each of the second and the third conductive patterns may include metal the same as the metal in the first conductive pattern. Additionally, each of the second and the third conductive patterns may have a circular cylinder shape, an elliptical cylinder shape or a polygonal cylinder shape.

According to example embodiments of the inventive concept, there is provided a semiconductor device including a substrate having an impurity region, a switching device disposed on the substrate, an electrode structure, a dielectric layer disposed on the electrode structure, and an upper electrode disposed on the dielectric layer. The electrode structure may have a first conductive pattern including metal, a second conductive pattern including metal oxide and a third conductive pattern disposed on the second conductive pattern. The first conductive pattern may be electrically connected to the impurity region. The second conductive pattern may be generated from the first conductive pattern.

In example embodiments of the inventive concept, the switching device may include a transistor having a channel formed in a direction substantially parallel to the substrate or a transistor having a channel formed in a direction substantially perpendicular to the substrate.

According to example embodiments of the inventive concept, there is provided a semiconductor device including a substrate having an impurity region, a transistor disposed on the substrate, an electrode structure, a dielectric layer covering the electrode structure, and an upper electrode disposed on the dielectric layer. The electrode structure may have a first conductive pattern, a second conductive pattern and a third conductive pattern extending from the second conductive pattern. The first conductive pattern may be electrically connected to the impurity region. The second conductive pattern may be disposed on the first conductive pattern. The third conductive pattern may be integrally formed with the second conductive pattern.

According to example embodiments of the inventive concept, there is provided a method of manufacturing a capacitor. In the method of manufacturing the capacitor, a preliminary insulation layer having a first opening is formed on an object. A preliminary first conductive pattern including metal is formed to fill the first opening. A second conductive pattern is formed from the preliminary first conductive pattern while forming a first conductive pattern from the preliminary first conductive pattern. The second conductive pattern may protrude over the preliminary insulation layer and may include metal oxide generated from the preliminary first conductive pattern. An upper portion of the first conductive pattern is exposed by partially removing the preliminary insulation layer. A dielectric layer is formed on the first and the second conductive patterns. An upper electrode is formed on the dielectric layer.

In example embodiments of the inventive concept, a resistance of the second conductive pattern may be adjusted. Here, the resistance of the second conductive pattern may be adjusted by a reduction process performed under an atmosphere including hydrogen or ammonia.

In example embodiments of the inventive concept, the first and the second conductive patterns may be formed by oxidizing the preliminary first conductive pattern. For example, the preliminary first conductive pattern may be oxidized by a thermal oxidation process or a plasma oxidation process.

In example embodiments of the inventive concept, a sacrificial layer having a second opening may be additionally formed on the preliminary insulation layer before forming the second conductive pattern. A first sacrificial pattern may be formed on a sidewall of the second opening. A second sacrificial pattern may be formed to fill the second opening. A third opening may be formed by removing the first sacrificial pattern. The third opening may expose the preliminary first conductive pattern. The second conductive pattern may be formed in the third opening.

According to example embodiments of the inventive concept, there is provided a method of manufacturing a capacitor. In the method of manufacturing the capacitor, an insulation layer is formed on a substrate. A first conductive pattern including metal is formed to be buried in the insulation layer. A second conductive pattern including metal oxide is generated from the first conductive pattern. A third conductive pattern is formed on the second conductive pattern. A dielectric layer is formed on the second and the third conductive patterns. An upper electrode is formed on the dielectric layer.

In example embodiments of the inventive concept, a supporting member may be additionally formed between adjacent elements of the third conductive patterns.

In example embodiments of the inventive concept, a first sacrificial layer may be formed on the insulation layer before forming the second conductive pattern. A second sacrificial layer may be formed on the first sacrificial layer to cover the second conductive pattern. An opening exposing the second conductive pattern may be formed by etching the second sacrificial layer. A third conductive pattern may be formed on the second conductive pattern and a sidewall of the opening.

In example embodiments of the inventive concept, a sacrificial layer may be formed on the first conductive pattern and the insulation layer. A first opening exposing the first conductive pattern may be formed by etching the sacrificial layer. A first sacrificial pattern may be formed on a sidewall of the first opening. A second sacrificial pattern may be formed to fill the first opening. A second opening may be formed by removing the first sacrificial pattern. The second opening may partially expose the first conductive pattern. The second conductive pattern may be formed to fill the second opening.

According to example embodiments of the inventive concept, there is provided a method of manufacturing a capacitor. In the method of manufacturing the capacitor, an insulation layer is formed on a substrate. A first conductive pattern including metal is formed to be buried in the insulation layer. A sacrificial conductive pattern including metal oxide is generated from the first conductive pattern. The first conductive pattern is exposed by removing the sacrificial conductive pattern. A second conductive pattern is formed on the first conductive pattern. A third conductive pattern is formed on the second conductive pattern. A dielectric layer is formed on the second and the third conductive patterns. An upper electrode is formed on the dielectric layer.

In example embodiments of the inventive concept, a sacrificial layer may be formed to cover the sacrificial conductive pattern. A first opening may be formed by etching the sacrificial layer. The first opening may expose the sacrificial conductive pattern. A second opening exposing the first conductive pattern may be formed by removing the sacrificial conductive pattern. The second opening may be connected to the first opening. A second conductive pattern may be formed on the first conductive pattern and a sidewall of the second opening. A third conductive pattern may be formed on a sidewall of the first opening. The third conductive pattern may extend from the second conductive pattern.

According to example embodiments of the inventive concept, the capacitor may have the electrode structure include a metal pattern and a metal oxide pattern without a photolithography process. Hence, the capacitor may ensure a high integration degree with a low manufacturing cost and time through simplified processes. For example, the first conductive pattern including metal may be integrally formed with the second conductive pattern including metal oxide, so that each of the electrode structure and the capacitor may have enhanced structural stability even though the electrode structure and/or the capacitor has a considerably high aspect ratio. Additionally, the capacitor may have a greatly effective area because the third conductive pattern including various conductive materials may be additionally provided on the second conductive pattern. Thus, the capacitor and/or the semiconductor device may have greatly improved storage capacity and integration degree. Furthermore, the resistance of the second conductive pattern of the electrode structure may be properly adjusted, so that the capacitor and the semiconductor device may ensure desired electrical characteristics.

BRIEF DESCRIPTION OF THE DRAWINGS

Example embodiments of the inventive concept will be more clearly understood from the following detailed description taken in conjunction with the accompanying drawings. FIGS. 1 to 19 represent non-limiting, example embodiments of the inventive concept as described herein.

FIG. 1 is a cross-sectional view illustrating a capacitor having an electrode structure in accordance with example embodiments of the inventive concept.

FIG. 3 is a graph illustrating thicknesses of second conductive patterns obtained by varying process conditions of oxidation processes in accordance with example embodiments of the inventive concept.

FIG. 4 is a cross-sectional view illustrating a capacitor including an electrode structure in accordance with example embodiments of the inventive concept.

FIG. 6 is a cross-sectional view illustrating a capacitor having an electrode structure in accordance with example embodiments of the inventive concept.

FIG. 8 is a cross-sectional view illustrating a capacitor including an electrode structure in accordance with example embodiments of the inventive concept.

FIG. 10 is a cross-sectional view illustrating a capacitor including an electrode structure in accordance with example embodiments of the inventive concept.

FIG. 12 is a cross-sectional view illustrating a capacitor including an electrode structure in accordance with example embodiments of the inventive concept.

FIG. 13 is a cross-sectional view illustrating a method of manufacturing a capacitor including an electrode structure in accordance with example embodiments of the inventive concept.

FIG. 14 is a cross-sectional view illustrating a semiconductor device including an electrode structure in accordance with example embodiments of the inventive concept.

FIG. 16 is a cross-sectional view illustrating a semiconductor device including an electrode structure in accordance with example embodiments of the inventive concept.

FIG. 18 is a block diagram illustrating a memory system having a memory device that includes a capacitor with an electrode structure in accordance with example embodiments of the inventive concept.

FIG. 19 is a block diagram illustrating a memory system having a memory device that includes a capacitor with an electrode structure in accordance with example embodiments of the inventive concept.

DESCRIPTION OF EMBODIMENTS

Figure 1:
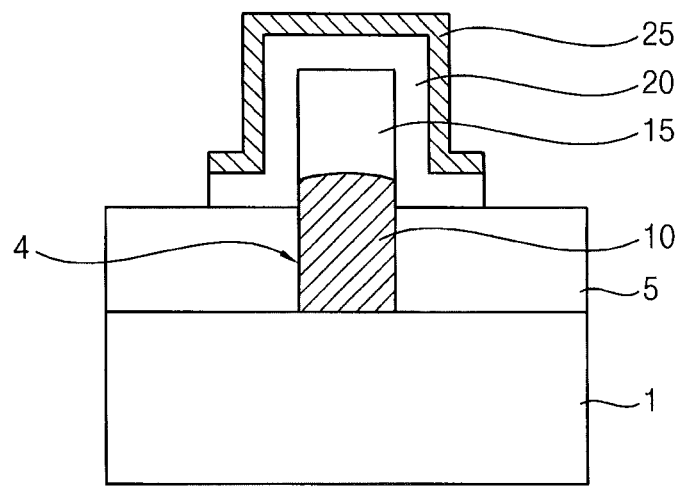

Various example embodiments of the inventive concept will be described more fully hereinafter with reference to the accompanying drawings, in which some example embodiments of the inventive concept are shown. The present inventive concept may, however, be embodied in many different forms and should not be construed as limited to the example embodiments of the inventive concept set forth herein. Rather, these example embodiments of the inventive concept are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout this description. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments of the inventive concept only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the inventive concept are described herein with reference to cross-sectional illustrations that are schematic illustrations of idealized example embodiments of the inventive concept (and intermediate structures). As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a cross-sectional view illustrating a capacitor having an electrode structure in accordance with example embodiments of the inventive concept.

Referring to FIG. 1, a capacitor 40 includes an electrode structure partially buried in an insulation layer 5 formed on an object 1, a dielectric layer pattern 20 formed on the electrode structure, and an upper electrode 25 formed on the dielectric layer pattern 20. The electrode structure may have a portion buried in the insulation layer 5. For example, a lower portion of the electrode structure may be buried in the insulation layer 5 while an upper portion of the electrode structure may protrude over the insulation layer 5.

The electrode structure includes a first conductive pattern 10 partially buried in the insulation layer 5 and a second conductive pattern 15 disposed on the first conductive pattern 10.

The object 1 having the capacitor 40 thereon may include a substrate and a lower structure including a conductive layer, a conductive pattern, a contact, a plug, etc. When the object 1 includes the substrate, the substrate may include a semiconductor substrate, a substrate having a semiconductor layer, etc. For example, the substrate may include a silicon (Si) substrate, a germanium (Ge) substrate, a silicon-germanium (Si—Ge) substrate, a silicon-on-insulator (SOI) substrate, a germanium-on-insulator (GOI) substrate, etc. In an example embodiment, a switching device may be formed on the object 1. The switching device may include a transistor having a conductive region, such as an impurity region or a diffusion region.

The insulation layer 5 includes an opening 4 exposing a predetermined portion of the object 1. For example, the opening 4 of the insulation layer 5 may expose a conductive region, a conductive pattern, a contact, or a plug provided on the object 1. The insulation layer 5 may include oxide, nitride, oxynitride, etc. For example, the insulation layer 5 may include silicon oxide, silicon nitride, silicon oxynitride, etc. Alternatively, the insulation layer 5 may have a multi-layered structure that includes an oxide film, a nitride film and/or an oxynitride film.

The first conductive pattern 10 is disposed on the object 1 to fill the opening 4 and to partially protrude from the opening 4. For example, a lower portion of the first conductive pattern 10 may be positioned in the opening 4 while an upper portion of the first conductive pattern 10 may protrude over the insulation layer 5. That is, the first conductive pattern 10 may include a first portion buried in the insulation layer 5 and a second portion protruding above the insulation layer 5.

The second portion of the first conductive pattern 10 protruding over the opening 4 may have a height substantially smaller than that of the first portion of the first conductive pattern 10 buried in the opening 4 formed through the insulation layer 5. The first conductive pattern 10 may have various three-dimensional structures depending on a shape of the opening 4. For example, the first conductive pattern 10 may have a substantially circular pillar structure, a substantially elliptical pillar structure, a substantially polygonal pillar structure, etc. Further, the first conductive pattern 10 may have a cross section of a substantially circular shape, a substantially elliptical shape, a substantially polygonal shape, etc.

In example embodiments of the inventive concept, the first conductive pattern 10 may include a metal that may expand to ensure a desired volume through an oxidation process. For example, the first conductive pattern 10 may include tungsten (W), ruthenium (Ru), indium (In), etc.

The second conductive pattern 15 may be generated from the first conductive pattern 10 and may protrude from the first conductive pattern 10 in a direction substantially perpendicular to an upper surface of the object 1. When the second conductive pattern 15 is generated from the first conductive pattern 10, the second conductive pattern 15 may have a structure substantially the same as or substantially similar to that of the first conductive pattern 10. For example, the second conductive pattern 15 may also have various three-dimensional structures, such as a substantially circular pillar structure, a substantially elliptical pillar structure, a substantially polygonal pillar structure, etc. Further, the second conductive pattern 15 may have a cross-sectional shape substantially the same as or substantially similar to that of the first conductive pattern 10. For example, the second conductive pattern 15 may have a cross section of a substantially circular shape, a substantially elliptical shape, a substantially polygonal shape, etc.

In example embodiments of the inventive concept, the second conductive pattern 15 may include conductive metal oxide caused by metal included in the first conductive pattern 10. For example, the second conductive pattern 15 may include tungsten oxide (WOx), ruthenium oxide (RuOx), indium oxide (InOx), etc. When the first conductive pattern 10 includes tungsten and the second conductive pattern 15 includes tungsten oxide generated from the first conductive pattern 10, tungsten oxide may have a work function substantially higher than that of tungsten. Although tungsten has a relatively high work function of about 4.5 eV, tungsten oxide may have a work function substantially higher than that of tungsten because of strong atomic bonds in tungsten oxide. That is, the second conductive pattern 15 may have a work function substantially higher than that of the first conductive pattern 10. Thus, the capacitor 40 having the electrode structure including the first and second conductive patterns 10 and 15 may have improved electrical characteristics.

The dielectric layer pattern 20 is disposed on the insulation layer 5 to cover the second conductive pattern 15 and the second portion of the first conductive pattern 10. The dielectric layer pattern 20 may be formed uniformly on the insulation layer 5 along a profile of the electrode structure. Thus, the dielectric layer pattern 20 may have a central portion on the first and the second conductive pattern 10 and 15 substantially higher than that of a lateral portion on the insulation layer 5. The dielectric layer pattern 20 may include oxide, nitride and/or metal oxide. For example, the dielectric layer pattern 20 may include silicon oxide (SiOx), silicon nitride (SiNx), hafnium oxide (HfOx), aluminum oxide (AlOx), lanthanum oxide (LaOx), yttrium oxide (YOx), lanthanum aluminum oxide (LaAlxOy), tantalum oxide (TaOx), etc. These may be used alone or in a combination thereof.

In some example embodiments of the inventive concept, the dielectric layer pattern 20 may have a multi layer structure that includes a first oxide film pattern, a nitride film pattern and/or a second oxide film pattern. Here, the first and the second oxide film patterns may include silicon oxide or metal oxide, and the nitride film pattern may include silicon nitride.

The upper electrode 25 is located on the dielectric layer pattern 20. The upper electrode 25 may be formed uniformly along a profile of the dielectric layer pattern 20. That is, the upper electrode 25 may have a central portion substantially higher than that of a lateral portion thereof. The upper electrode 25 may include a conductive material such as a metal, metal compound and/or polysilicon. For example, the upper electrode 25 may include iridium (Ir), ruthenium, rhodium (Rh), palladium (Pd), aluminum, silver (Ag), platinum (Pt), titanium, tantalum, tungsten, aluminum nitride (AlNx), titanium nitride (TiNx), tantalum nitride (TaNx), tungsten nitride (WNx), polysilicon doped with impurities, etc. These may be used alone or in a combination thereof.

FIGS. 2A to 2D are cross-sectional views illustrating a method of manufacturing a capacitor having an electrode structure in accordance with example embodiments of the inventive concept. The capacitor obtained by the method described with reference to FIGS. 2A to 2D may have a structure substantially the same as or substantially similar to that of the capacitor described with reference to FIG. 1.

Figure 2A:
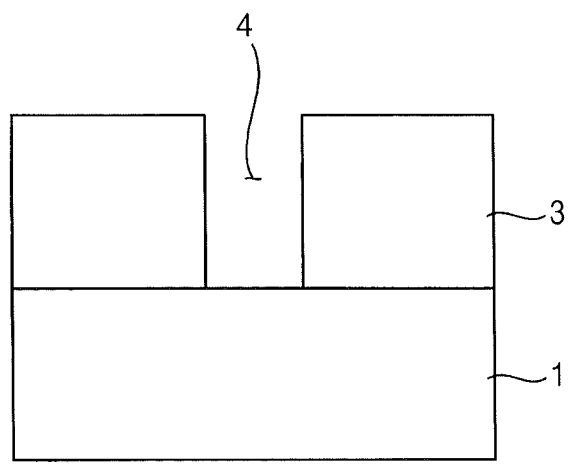
FIGS. 2A to 2D are cross-sectional views illustrating a method of manufacturing a capacitor having an electrode structure in accordance with example embodiments of the inventive concept.

Referring to FIG. 2A, a preliminary insulation layer 3 is formed on an object 1. The object 1 may include a substrate, such as a semiconductor substrate, a substrate having a semiconductor layer thereon, etc. A lower structure having a conductive layer, a conductive pattern, a contact, a plug, etc. may be provided on the substrate. Further, a conductive region such as an impurity region or a diffusion region may be formed on the object 1. A switching device such as a transistor or a diode may be provided on the object 1. Here, the preliminary insulation layer 3 may be formed on the object 1 to cover the lower structure, the switching device, the conductive region, etc.

The preliminary insulation layer 3 may be formed using oxide, nitride or oxynitride. For example, the preliminary insulation layer 3 may be formed using undoped silicate glass (USG), spin on glass (SOG), flowable oxide (FOX), fluorosilicate glass (FSG), tonen silazene (TOSZ®), boro-phosphor silicate glass (BPSG), phosphosilicate glass (PSG), tetraethyl orthosilicate (TEOS), plasma enhanced-TEOS (PE-TEOS), high density plasma-chemical vapor deposition (HDP-CVD) oxide, etc. Further, the preliminary insulation layer 3 may be formed by a chemical vapor deposition (CVD) process, a high density plasma-chemical vapor deposition (HDP-CVD) process, a plasma enhanced chemical vapor deposition (PECVD) process, a low pressure chemical vapor deposition (LPCVD) process, a spin coating process, etc.

In example embodiments of the inventive concept, the preliminary insulation layer 3 may have a level surface through a planarization process. For example, the flat surface of the preliminary insulation layer 3 may be obtained by a chemical mechanical polishing (CMP) process and/or an etch-back process.

A first mask (not illustrated) is formed on the preliminary insulation layer 3. An opening 4 is formed by partially etching the preliminary insulation layer 3 using the first mask as an etching mask. The opening 4 may expose a predetermined portion of the object 1 or may partially expose the lower structure. For example, the opening 4 may expose the conductive region, the conductive pattern, the pad, etc. The first mask may be formed using a material having an etching selectivity with respect to the preliminary insulation layer 3 and the object 1. For example, the first mask may be formed using an organic material, such as photoresist.

Figure 2B:
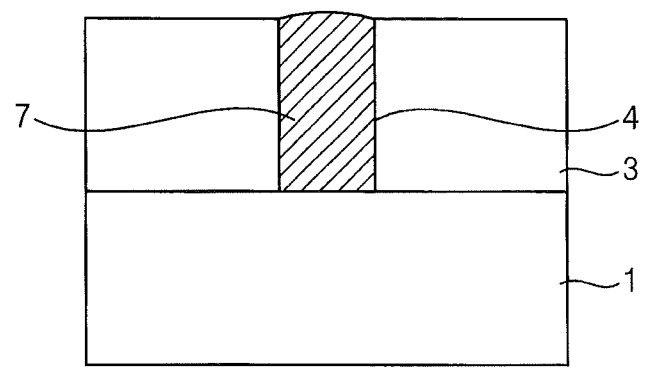

Referring to FIG. 2B, after removing the first mask from the preliminary insulation layer 3, a metal layer (not illustrated) is formed on the preliminary insulation layer 3 to fill the opening 4. The metal layer may be uniformly formed on a sidewall and a bottom of the opening 4 and the preliminary insulation layer 3 along a profile of the opening 4.

In example embodiments of the inventive concept, the metal layer may be formed using metal that may easily expand in volume through an oxidation process. For example, the metal layer may be formed using tungsten, ruthenium, indium, etc. Additionally, the metal layer may be formed by a sputtering process, a CVD process, an atomic layer deposition (ALD) process, a pulsed laser deposition (PLD) process, a vacuum evaporation process, etc.

A preliminary first conductive pattern 7 is formed in the opening 4 by partially removing the metal layer until the preliminary insulation layer 3 is exposed. The preliminary first conductive pattern 7 may be formed in the opening 4 by a CMP process. Here, the preliminary first conductive pattern 7 may have a convex upper face in which a central portion of the preliminary first conductive pattern 7 may protrude more than a lateral portion of the first preliminary conductive pattern 7, so the preliminary first conductive pattern 7 may have a rounded upper face. When the preliminary first conductive pattern 7 has the convex upper face, a second conductive pattern 15 (see FIG. 2C) may be formed uniformly from the preliminary first conductive pattern 7 along a direction substantially perpendicular to the object 1. That is, any mold may not be required in a process of forming the second conductive pattern 15 when the preliminary first conductive pattern 7 has the convex upper face. Meanwhile, the second conductive pattern 15 may be formed along random directions when the preliminary first conductive pattern 7 has a concave upper face. Thus, it may be difficult to obtain the second conductive pattern 15 having a desired height and also the second conductive pattern 15 may have poor uniformity. In example embodiments of the inventive concept, by controlling process conditions of the process for the preliminary first conductive pattern 7, the preliminary first conductive pattern 7 may ensure the convex upper face considering the formation of the second conductive pattern 15.

According to some example embodiments of the inventive concept, the preliminary first conductive pattern 7 having a convex upper face may be obtained by two CMP processes. For example, a first CMP process may be performed on the metal layer using a first slurry that contains a first content of hydrogen peroxide ($H_2O_2$). Then, a second CMP process may be executed on the metal layer using a second slurry that contains a second content of hydrogen peroxide ($H_2O_2$). Here the first content of hydrogen peroxide may be substantially higher than the second content of hydrogen peroxide. Therefore, a preliminary first conductive pattern 7 having the convex upper face may be obtained while filling the opening 4. For example, the first content of hydrogen peroxide in the first slurry may be equal to or greater than about 2%, and the second content of the hydrogen peroxide in the second slurry may be equal to or less than about 0.5%. The metal layer may be relatively rapidly polished by the first slurry whereas the preliminary insulation layer 3 may be relatively rapidly polished by the second slurry. Further, the first CMP process may be performed for about 3 seconds to about 2 minutes, and the second CMP process may be carried out for about 10 seconds to about 30 seconds. As described above, the preliminary first conductive pattern 7 having the convex upper face may be formed by the first and the second CMP processes using the first and the second slurries.

Figure 2C:
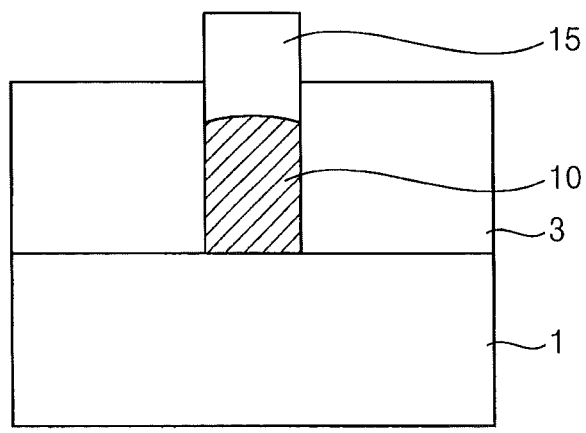

Referring to FIG. 2C, a second conductive pattern 15 is formed by performing an oxidation process about the preliminary first conductive pattern 7 having the convex upper face while forming the first conductive pattern 10 from the preliminary first conductive pattern 7. That is, the second conductive pattern 15 and the first conductive pattern 10 may be simultaneously obtained. For example, the oxidation process may be performed on the preliminary first conductive pattern 7 including metal, so that the second conductive pattern 15 including metal oxide may grow from the preliminary first conductive pattern 7. When the preliminary first conductive pattern 7 includes tungsten, ruthenium or iridium, the second conductive pattern 15 may include tungsten oxide, ruthenium oxide or iridium oxide. In the formation of the second conductive pattern 15, the preliminary first conductive pattern 7 may be changed into the first conductive pattern 10. Because a portion of the preliminary first conductive pattern 7 may be oxidized to form the second conductive pattern 15, the first conductive pattern 10 may have a height substantially smaller than that of the preliminary first conductive pattern 7. That is, the first conductive pattern 10 may partially fill the opening 4 and may have a height substantially smaller than that of the opening 4. The second conductive pattern 15 may fill the opening 4 and may protrude over an upper face of the preliminary insulation layer 3. Namely, a lower portion of the second conductive pattern 15 may be buried in the opening 4, and an upper portion of the second conductive pattern 15 may protrude over the preliminary insulation layer 3 in a direction substantially perpendicular to the object 1.

In example embodiments of the inventive concept, the first and the second conductive patterns 10 and 15 may be formed by a thermal oxidation process or a plasma oxidation process. For example, the preliminary first conductive pattern 7 may be treated by a rapid thermal anneal (RTA) process at a relatively high temperature under an atmosphere including oxygen, so that an electrode structure including the first and the second conductive pattern 10 and 15 may be obtained from the preliminary first conductive pattern 7. The RTA process may be performed at a temperature of about 400° C. to about 600° C. for about 1 minute to about 20 minutes. Alternatively, the first and the second conductive patterns 10 and 15 may be formed by a plasma oxidation process to obtain the electrode structure while the preliminary first conductive pattern 7 is exposed to oxygen plasma by applying a power above about 20 W.

According to example embodiments of the inventive concept, the second conductive pattern 15 may be formed by a volume expansion of metal oxide generated from metal in the preliminary first conductive pattern 7 in the oxidation process. Hence, dimensions of the second conductive pattern 15 may be controllable by adjusting process conditions of the oxidation process. Main factors determining the dimensions of the second conductive pattern 15 may include a temperature and a processing time. Here, the temperature of the oxidation process may be a predominant factor than the process time for determining the dimensions of the second conductive patterns 15.

Hereinafter, dimension variations of second conductive patterns in accordance with process conditions in oxidation processes will be described.

Figure 3:
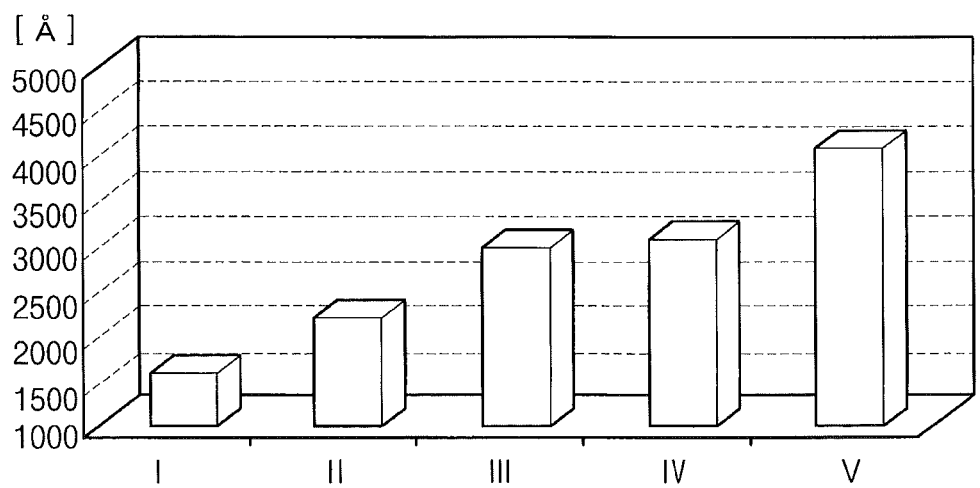

FIG. 3 is a graph illustrating thicknesses of second conductive patterns obtained under different process conditions of oxidation processes in accordance with example embodiments of the inventive concept. The second conductive patterns in FIG. 3 are formed by oxidizing preliminary first conductive patterns under an atmosphere including oxygen through RTA processes. In FIG. 3, "I" indicates a thickness of a second conductive pattern formed by an oxidation process performed at a temperature of about 550° C. for about 2 minutes. Additionally, "II," "III" and "IV" denote thicknesses of second conductive patterns formed by oxidation processes at a temperature of about 600° C. for about 2 minutes, about 5 minutes and about 10 minutes, respectively. Furthermore, "V" represents a thickness of a second conductive pattern formed by an oxidation process at a temperature of about 650° C. for about 10 minutes.

As illustrated in FIG. 3, when the temperature of the oxidation process increases by about 1.1 times from about 550° C. to about 600° C. while maintaining the process time of about 2 minutes, the thickness of the second conductive pattern may also increase by about 1.38 times from about 1,600 Å (I) to about 2,200 Å (II). Additionally, when the temperature of the oxidation process increases by about 1.08 times from about 600° C. to about 650° C. while keeping the process time of about 10 minutes, the thickness of the second conductive pattern may be also increase by about 1.32 times from about 3,100 Å (IV) to about 4,100 Å (V).

When the process times increase respectively by 2.5 times from about 2 minutes to about 5 minutes and by and 5 times from about 2 minutes to about 10 minutes while maintaining the temperature of about 600° C., the thicknesses of the second conductive patterns may increase respectively by about 1.36 times from about 2,200 Å (II) to about 3,000 Å (III) and by and about 1.41 times from about 2,200 Å (II) to about 3,100 Å (IV), respectively. When the second conductive pattern is formed from the preliminary first conductive pattern by the oxidation process, the temperature of the oxidation process may be dominant factor rather than the process time of the oxidation process. That is, the dimensions of the second conductive pattern may be more easily controlled by adjusting the temperature of the oxidation process. Accordingly, the dimensions of the second conductive pattern such as the thickness and the width of the second conductive pattern may be advantageously adjusted according to various design rules of various semiconductor devices.

Figure 2D:
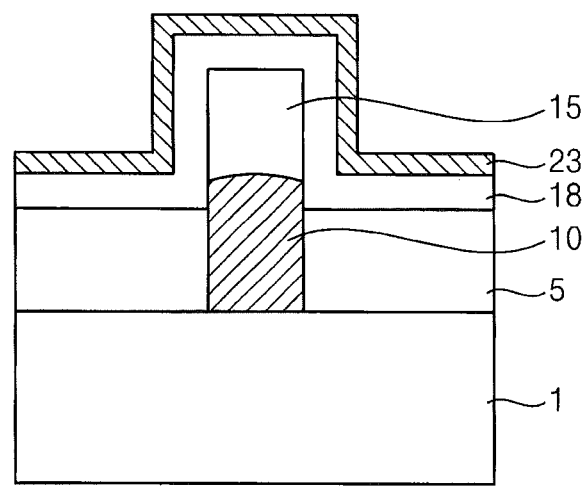

Referring to FIG. 2D, an insulation layer 5 is formed to expose a lower portion of the second conductive pattern 15 and an upper portion of the first conductive pattern 10 of the electrode structure by partially removing the preliminary insulation layer 3. When the preliminary insulation layer 3 includes oxide, the insulation layer 5 may be formed by an etching process using an etching gas or an etching solution including hydrogen fluoride (HF). When the preliminary insulation layer 3 includes nitride, the insulation layer 5 may be formed by an etching process using an etching gas or an etching solution including phosphoric acid ($H_3PO_4$).

When the insulation layer 5 is formed on the object 1, the upper portion of the first conductive pattern 10 and the second conductive pattern 15 are exposed. In other words, the upper portion of the first conductive pattern 10 may protrude over an upper portion of the insulation layer 5 because the insulation layer 5 has a thickness substantially smaller than that of the preliminary insulation layer 3.

A dielectric layer 18 is formed on the insulation layer 5 to cover the second conductive pattern 15 and the exposed first conductive pattern 15. The dielectric layer 18 may be formed using metal oxide and/or nitride. For example, the dielectric layer 18 may be formed using hafnium oxide, zirconium oxide, aluminum oxide, tantalum oxide, titanium oxide, silicon nitride, etc. These may be used alone or in a combination thereof. Further, the dielectric layer 18 may be formed by an ALD process, a CVD process, a vacuum deposition process, a PECVD process, etc. The dielectric layer 18 may be formed uniformly on the insulation layer 5 along a profile of the electrode structure.

According to some example embodiments of the inventive concept, the dielectric layer 18 may be formed by sequentially forming an oxide film, a nitride film and/or a metal oxide film on the electrode structure and the insulation layer 5. That is, the dielectric layer 18 may have a multi layer structure that includes the oxide film, the nitride film and/or the metal oxide film.

An upper electrode layer 23 is formed on the dielectric layer 18. The upper electrode layer 23 may be uniformly formed on the dielectric layer 18 along the profile of the electrode structure. The upper electrode layer 23 may be formed using metal, metal compound and/or polysilicon. For example, the upper electrode layer 23 may be formed using iridium, ruthenium, rhodium, palladium, aluminum, silver, titanium, tantalum, aluminum nitride, titanium nitride, tantalum nitride, tungsten nitride, polysilicon doped with impurities, etc. These may be used alone or in a mixture thereof. Additionally, the upper electrode layer 23 may be formed on the dielectric layer 18 by an ALD process, a sputtering process, a vacuum deposition process, a PECVD process, a PLD process, etc.

A second mask (not illustrated) is formed on the upper electrode layer 23, and then the dielectric layer 18 and the upper electrode layer 23 are etched using the second mask as an etching mask. The second mask may be formed using a material having an etching selectivity relative to the upper electrode layer 23 and the dielectric layer 18. Therefore, a capacitor including the electrode structure having a construction substantially the same as or substantially similar to that of the electrode structure described with reference to FIG. 1 may be formed on the object 1.

As for the conventional method for manufacturing a capacitor having a stacked electrode disposed on a metal plug, such as a tungsten plug, a conductive layer for a lower electrode may be formed on the metal plug. When the conductive layer is patterned by a photolithography process and a dry etching process, the lower electrode may be provided on the metal plug. However, additional processes may be performed to form the lower electrode so that costs and time for manufacturing processes may increase. Further, a void or a seam may occur easily in the lower electrode when the lower electrode has a shape of a contact or a plug in a small contact hole formed through an insulation layer. As a design rule of a semiconductor device having a capacitor is reduced, an alignment error between the lower electrode and the metal plug may frequently occur, thereby deteriorating electrical characteristics and reliability of the semiconductor device. According to example embodiments of the inventive concept, an electrode structure for a capacitor may include a first conductive pattern and a second conductive pattern generated from the first conductive pattern, so that the electrode structure may be easily obtained without additional etching processes. Further, the second conductive pattern may include metal oxide grown from metal in the first electrode structure, the formation of void or seam in the electrode structure may be effectively prevented even though a semiconductor device including the capacitor has considerably minute design rule. Therefore, the capacitor having the electrode structure may ensure enhanced electrical characteristics and reliability.

Figure 4:
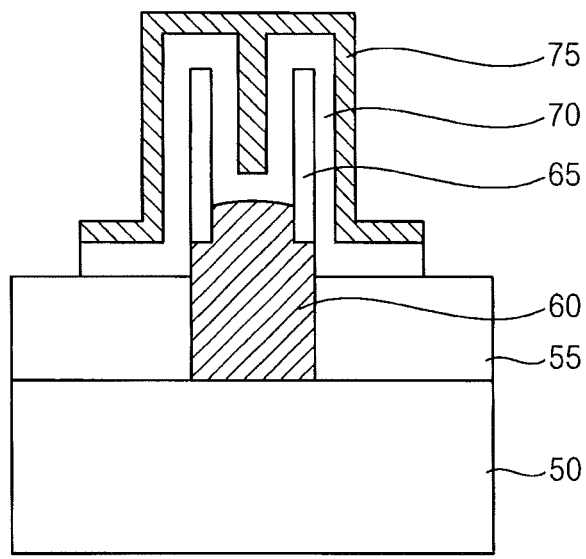

FIG. 4 is a cross-sectional view illustrating a capacitor including an electrode structure in accordance with some example embodiments of the inventive concept.

Referring to FIG. 4, a capacitor 95 includes an object 50, an insulation layer 55, an electrode structure including a first conductive pattern 60 and a second conductive pattern 65, a dielectric layer pattern 70, and an upper electrode 75.

The object 50 and the insulation layer 55 of the capacitor 95 illustrated in FIG. 4 may include materials and structures substantially the same as or substantially similar to those of the object 1 and the insulation layer 5 of the capacitor 40 described with reference to FIG. 1. Further, the first conductive pattern 60, the second conductive pattern 65, the dielectric layer pattern 70 and the upper electrode 75 may also have materials substantially the same as or substantially similar to those of the first conductive pattern 10, the second conductive pattern 15, the dielectric layer pattern 20 and the upper electrode 25 described with reference to FIG. 1.

The first conductive pattern 60 is formed on the object 50 to fill an opening (not illustrated) formed through the insulation layer 55, and the second conductive pattern 65 extends from an upper peripheral portion of the first conductive pattern 60 in a direction substantially perpendicular to the object 50. As described above with reference to FIG. 1, an upper portion of the first conductive pattern 60 may protrude over the insulation layer 55. The second conductive pattern 65 may be partially buried in the first conductive pattern 60.

In example embodiments of the inventive concept, the first conductive pattern 60 may have various three-dimensional structures, such as a substantially circular pillar, a substantially elliptical pillar, a substantially polygonal pillar, etc. The second conductive pattern 65 may have three-dimensional structures such as a substantially circular cylinder, a substantially elliptical cylinder, a substantially polygonal cylinder, etc. Further, the second conductive pattern 65 may have a cross-section, such as a substantially circular ring shape, a substantially elliptical ring shape, a substantially polygonal ring shape, etc. When the second conductive pattern 54 has a substantially cylindrical structure, a contacting area between the electrode structure and the dielectric layer pattern 70 may be increased, so the capacitor 95 may provide an improved storage capacity. Additionally, a lower portion of the second conductive pattern 65 may be partially buried in the first conductive pattern 60 because the second conductive pattern 65 is generated from the upper peripheral portion of the first conductive pattern 60. Thus, combination strength between the first and second conductive patterns 60 and 65 may increases and the electrode structure may have enhanced a structural stability.

The dielectric layer pattern 70 is disposed on the first conductive pattern 60 and the insulation layer 55 to enclose the second conductive pattern 65. Since the second conductive pattern 65 extends from the upper peripheral portion of the first conductive pattern 60, a lateral portion of the dielectric layer pattern 70 enclosing the second conductive pattern 65 may protrude more compared to a central portion of the dielectric layer pattern 70. Thus, a recess is provided at the central portion of the dielectric layer pattern 70.

The upper electrode 75 is positioned uniformly on the dielectric layer pattern 70 along a profile of the dielectric layer pattern 70. The upper electrode 75 may be provided on the dielectric layer pattern 70 to fill the recess of the dielectric layer pattern 70. That is, a central portion of the upper electrode 75 filling the recess of the dielectric layer pattern 70 may extend toward the electrode structure.

FIGS. 5A to 5D are cross-sectional views illustrating a method of manufacturing a capacitor having an electrode structure in accordance with some example embodiments of the inventive concept.

Figure 5A:
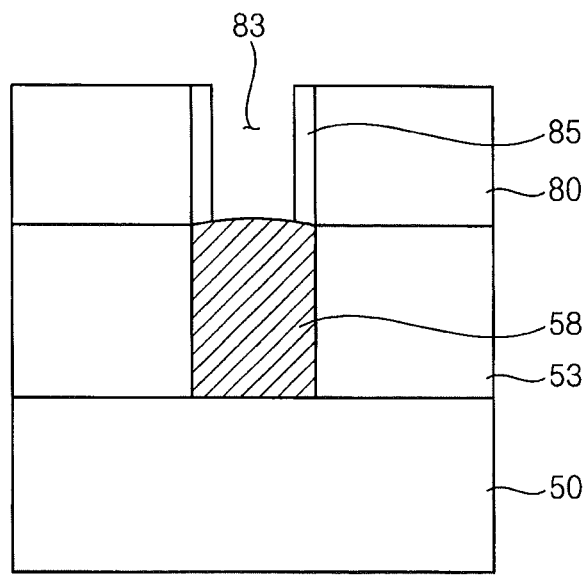
FIGS. 5A to 5D are cross-sectional views illustrating a method of manufacturing a capacitor having an electrode structure in accordance with example embodiments of the inventive concept.

Referring to FIG. 5A, by performing processes substantially the same as or substantially similar to those described with reference to FIG. 2A, a preliminary insulation layer 53 having a first opening (not illustrated) is formed on an object 50. A preliminary first conductive pattern 58 having a convex upper face may be formed on the object 50 to fill the first opening.

A sacrificial layer 80 is formed on the preliminary first conductive pattern 58 and the preliminary insulation layer 53. The sacrificial layer 80 may be formed using oxide, nitride or oxynitride by a CVD process, a PECVD process, an HDP-CVD process, a spin coating process, etc. In example embodiments of the inventive concept, the sacrificial layer 80 and the preliminary insulation layer 53 may be formed using substantially the same as or substantially similar materials. Alternatively, the sacrificial layer 80 may be formed using a material different from that of the preliminary insulation layer 53.

A mask (not illustrated) is formed on the sacrificial layer 80. The sacrificial layer 80 is partially etched using the mask as an etching mask so that a second opening 83 is formed through the sacrificial layer 80. The second opening 83 exposes the preliminary first conductive pattern 58. Here, the second opening 83 may have a width substantially the same as that of the preliminary first conductive pattern 58.

A first sacrificial pattern 85 is formed on a sidewall of the second opening 83. For example, the first sacrificial pattern 85 may have a shape of a spacer. The first sacrificial pattern 85 may have a width substantially the same as that of the second conductive pattern 65 formed in a subsequent process (see FIG. 5C).

In example embodiments of the inventive concept, a first insulation layer (not illustrated) is formed on the preliminary first conductive pattern 58, the sidewall of the second opening 83 and the sacrificial layer 80. The first insulation layer may be formed by a CVD process, a PECVD process, an HDP-CVD process, a spin coating process, etc. The first sacrificial pattern 85 may be formed only on the sidewall of the second opening 83 by partially etching the first insulation layer. The first sacrificial pattern 85 may be formed on the sidewall of the second opening 83 by partially removing the first insulation layer through an anisotropic etching process.

In example embodiments of the inventive concept, the first sacrificial pattern 85 may include a material having an etching selectivity with respect to the preliminary insulation layer 53 and the sacrificial layer 80. For example, when the preliminary insulation layer 53 and the sacrificial layer 80 include oxides, the first sacrificial pattern 85 may include nitride or oxynitride. Alternatively, the first sacrificial pattern 85 may include oxide when the preliminary insulation layer 53 and the sacrificial layer 80 include nitrides.

Figure 5B:
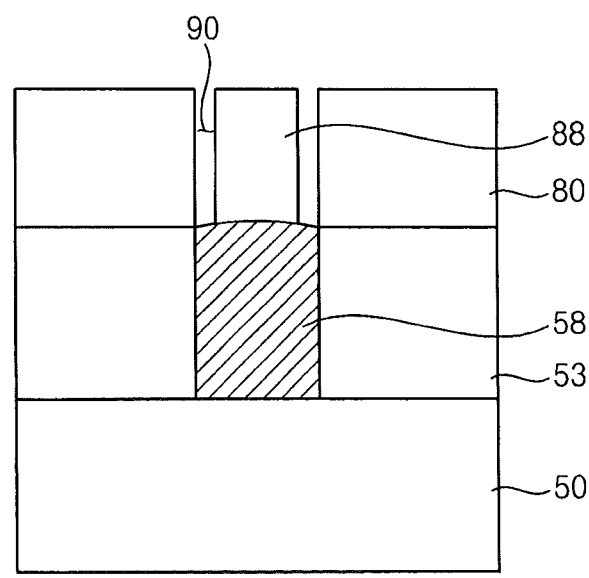

Referring to FIG. 5B, a second sacrificial pattern 88 is formed on the preliminary first conductive pattern 58 to fill the second opening 83. A bottom face of the second sacrificial pattern 88 may make contact with the preliminary first conductive pattern 58, and a lateral face of the second sacrificial pattern 88 may contact the first sacrificial pattern 85. The second sacrificial pattern 88 may be formed using a material having an etching selectivity relative to the first sacrificial pattern 85. For example, the second sacrificial pattern 88 may be formed using oxide, nitride, oxynitride, photoresist, etc.

In the formation of the second sacrificial pattern 88, a second insulation layer (not illustrated) may be formed on the sacrificial layer 80 and the first sacrificial pattern 85 to fill the second opening 83. By partially removing the second insulation layer until the sacrificial layer 80 is exposed, the second sacrificial pattern 88 may be formed in the second opening 83. The second insulation layer may be formed by a CVD process, a PECVD process, an HDP-CVD process, a spin coating process, etc. The second sacrificial pattern 88 may be formed by a CMP process and/or an etch-back process.

In example embodiments of the inventive concept, the second sacrificial pattern 88 may include a material substantially the same as or substantially similar to that of the preliminary insulation layer 53 and/or the sacrificial layer 80. For example, when the preliminary insulation layer 53 and the sacrificial layer 80 include oxides, the second sacrificial pattern 88 may include oxide. Here, the first sacrificial pattern 85 may include nitride or oxynitride. When the first sacrificial pattern 85 includes oxide, the second sacrificial pattern 88, the preliminary insulation layer 53 and the sacrificial layer 80 may include nitrides or oxynitrides, respectively.

Referring now to FIG. 5B, the first sacrificial pattern 85 is removed from the sidewall of the second opening 83, such that a third opening 90 is formed to expose an upper peripheral portion of the preliminary first conductive pattern 58 (i.e., a upper rim portion of the preliminary first conductive pattern 58). When the first sacrificial pattern 85 includes oxide, the first sacrificial pattern 85 may be removed using an etching gas or an etching solution including hydrogen fluoride. When the first sacrificial pattern 85 includes nitride, the first sacrificial pattern 85 may be removed using an etching gas or an etching solution including phosphoric acid.

Because each of the second sacrificial pattern 88, the preliminary insulation layer 53 and the sacrificial layer 80 includes a material different from that of the first sacrificial pattern 85, the second sacrificial pattern 88, the preliminary insulation layer 53 and the sacrificial layer 80 may not be etched in the formation of the third opening 90 by removing the first sacrificial pattern 85.

Figure 5C:
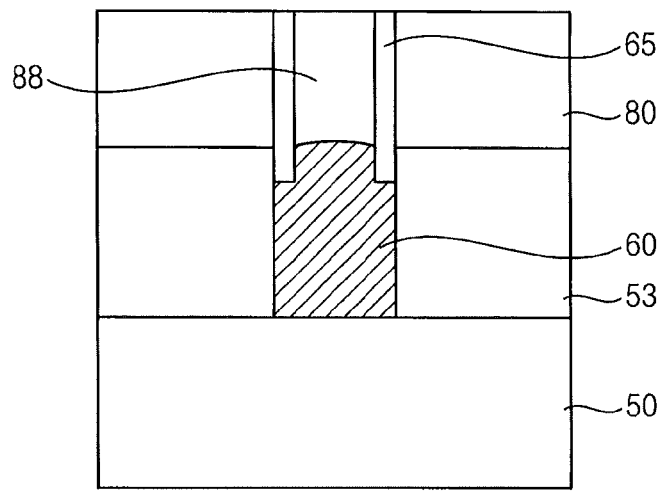

Referring to FIG. 5C, the second conductive pattern 65 is formed to fill the third opening 90 by growing metal oxide from a portion of the preliminary first conductive pattern 58 exposed through the third opening 90. The second conductive pattern 65 may grow in the third opening 90 having a cylindrical shape, and thus the second conductive pattern 65 may also have a substantially cylindrical structure. As the second conductive pattern 65 is formed, the preliminary first conductive pattern 58 may be changed into a first conductive pattern 60. An oxidation process for forming the second conductive pattern 65 may be substantially the same as or substantially similar to the process described with reference to FIG. 2C. When the first and the second conductive patterns 60 and 65 are formed, an electrode structure having the first and the second conductive patterns 60 and 65 is formed on the object 50. Here, the electrode structure may have a construction substantially the same as or substantially similar to the electrode structure described with reference to FIG. 4.

In example embodiments of the inventive concept, the preliminary first conductive pattern 58 may not have a convex upper face because the second conductive pattern 65 is formed in the third opening 90. Because the sacrificial layer 80 and the second sacrificial pattern 88 providing the third opening 90 may serve as a mold, metal oxide may easily grow from the preliminary first conductive pattern 58 in the third opening 90. Even though the metal oxide grows from the preliminary first conductive pattern 58 in random directions, the growth direction of the metal oxide may be confined by the third opening 90, thereby forming the second conductive pattern 65 in the third opening 90 regardless of a surface condition of the preliminary first conductive pattern 58. Therefore, the preliminary first conductive pattern 58 may have a convex upper face and/or a concave upper face.

Figure 5D:
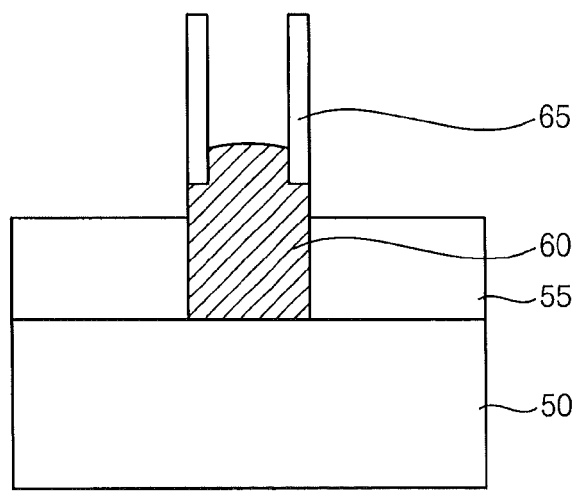

Referring to FIG. 5D, an insulation layer 55 is formed to expose an upper portion of the first conductive pattern 60 by removing the second sacrificial pattern 88 and the sacrificial layer 80 and a portion of the preliminary insulation layer 53 from the electrode structure. When the second sacrificial pattern 88, the sacrificial layer 80 and the preliminary insulation layer 53 include substantially the same material, the second sacrificial pattern 88, the sacrificial layer 80 and the portion of the preliminary insulation layer 53 may be removed simultaneously by performing one etching process. Alternatively, the second sacrificial pattern 88 and the sacrificial layer 80 may be removed by a first etching process, and then the portion of the preliminary insulation layer 53 may be removed by a second etching process to form the insulation layer 55.

A dielectric layer (not illustrated) and an upper electrode layer (not illustrated) are sequentially formed on the electrode structure. The upper electrode layer and the dielectric layer are patterned to form a capacitor on the object 50. The capacitor may have a construction substantially the same as or substantially similar to that of the capacitor described with reference to FIG. 4.

Figure 6:
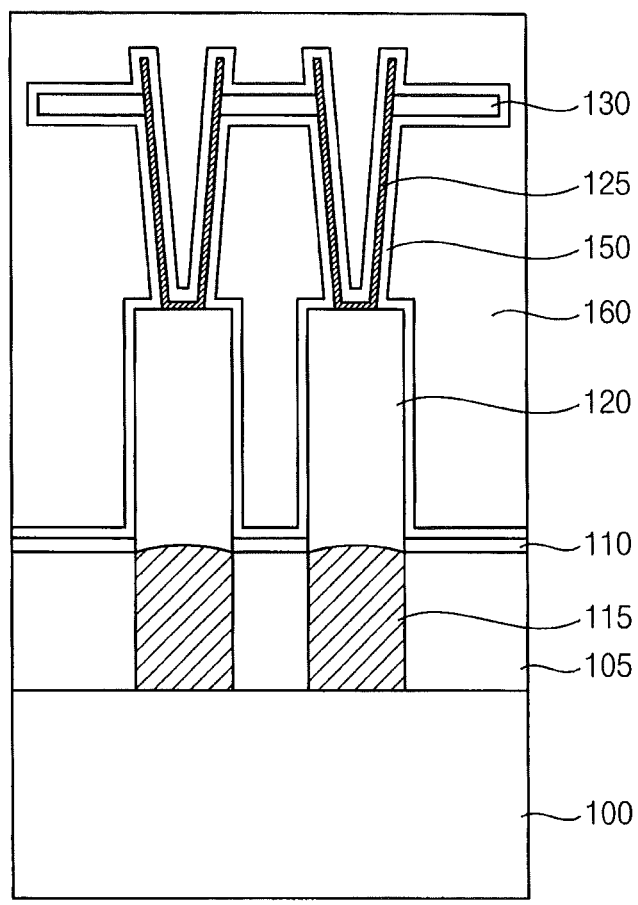

FIG. 6 is a cross-sectional view illustrating a capacitor having an electrode structure in accordance with some example embodiments of the inventive concept.

Referring to FIG. 6, the capacitor includes an electrode structure having a first conductive pattern 115, a second conductive pattern 120, a third conductive pattern 125, a dielectric layer 150, and an upper electrode 160. The first conductive pattern 115 may contact a substrate 100 and the second conductive pattern 120 may extend from the first conductive pattern 115. The third conductive pattern 125 may be disposed on the second conductive pattern 120.

The substrate 100 may include a semiconductor substrate, a substrate having a semiconductor layer, a metal oxide substrate, etc. For example, the substrate 100 may include a silicon substrate, a germanium substrate, a silicon-germanium substrate, an SOI substrate, a GOI substrate, an aluminum oxide substrate, etc. On the substrate 100, an underlying structure including a conductive region, a transistor, a diode, a contact, a plug, a pad, a conductive pattern, an insulation pattern, etc. may be provided.

The first conductive pattern 115 is positioned in an insulation layer 105 formed on the substrate 100. For example, the first conductive pattern 115 may be buried in the insulation layer 105. The first conductive layer 115 may be electrically connected to the conductive region of the substrate 100. The insulation layer 105 may have a single layer structure that includes an oxide layer, a nitride layer or an oxynitride layer. Alternatively, the insulation layer 105 may have a multi layered structure that includes an oxide film, a nitride film and/or an oxynitride film.

In example embodiments of the inventive concept, the first conductive pattern 115 may be buried in the insulation layer 105 without protruding over the insulation layer 105. The first conductive pattern 115 may have a convex upper face as described above. In some example embodiments of the inventive concept, the first conductive pattern 115 may have a structure substantially the same as or substantially similar to that of the first conductive pattern 10 described with reference to FIG. 1. That is, an upper portion of the first conductive pattern 115 may protrude over the insulation layer 105.

The second conductive pattern 120 may extend from the first conductive pattern 115 in a direction substantially perpendicular to the substrate 100. The second conductive pattern 120 may include metal oxide generated from metal included in the first conductive pattern 115. The second conductive pattern 120 may have a three-dimensional structure substantially the same as or substantially similar to that of the first conductive pattern 115, such as various pillar structures. Additionally, the second conductive pattern 120 may have a cross-sectional shape substantially the same as or substantially similar to that of the first conductive pattern 115.

In example embodiments of the inventive concept, the first and the second conductive patterns 115 and 120 may be formed integrally because the second conductive pattern 120 includes metal oxide generated from the metal in the first conductive pattern 115. Even though the second conductive pattern 120 has a large height from the first conductive pattern 115, the electrode structure may not lean or collapse. That is, when the electrode structure including the first and the second conductive patterns 115 and 120 has a high aspect ratio, the electrode structure may not collapse or contact adjacent electrode structures.

An etch-stop layer 110 is disposed on the insulation layer 105. The etch-stop layer 110 may serve as a protection layer for the insulation layer 105 and the first conductive pattern 115 in etching processes for forming the capacitor. Thus, the etch-stop layer 110 may include a material having an etching selectivity with respect to the insulation layer 105 and the electrode structure. The etch-stop layer 110 may include nitride, oxynitride, metal oxide, etc. For example, the etch-stop layer 110 may include silicon nitride, silicon oxynitride, heated hafnium oxide, heated aluminum oxide, etc. These may be used alone or in a mixture thereof.

The third conductive pattern 125 is positioned on the second conductive pattern 120. The third conductive pattern 125 may have a substantially cylindrical structure. For example, the third conductive pattern 125 may have various structures such as a substantially circular cylinder, a substantially elliptical cylinder, a substantially polygonal cylinder, etc. The third conductive pattern 125 may include tungsten, titanium, tantalum, molybdenum, iridium, hafnium, zirconium, ruthenium, platinum, nickel, aluminum, copper, tungsten nitride, aluminum nitride, tantalum nitride, titanium nitride, molybdenum nitride, hafnium nitride, zirconium nitride, polysilicon doped with impurities, etc. These may be used alone or in a combination thereof.

In example embodiments of the inventive concept, the third conductive pattern 125 may include a material substantially the same as or substantially similar to that in the first conductive pattern 115. Alternatively, the first and the third conductive patterns 115 and 125 may include different materials, respectively. Further, the third conductive pattern 125 may have a structure in which an upper diameter may be substantially greater than a lower diameter. Namely, the third conductive pattern 125 may have an inclined sidewall having a predetermined slope. A lower portion of the third conductive pattern 125 may have a width substantially less than that of the second conductive pattern 120.

When the third conductive pattern 125 includes a material substantially the same as that of the first conductive pattern 115, adhesion strength between the second and the third conductive patterns 120 and 125 may be increased because the second conductive pattern 120 may be generated from the first conductive pattern 115.

A supporting member 130 is disposed between adjacent third conductive patterns 125. The supporting member 130 may prevent the adjacent conductive patterns from contacting or leaning on each other. Thus, the supporting member 130 may improve the structural stability of the electrode structure. The supporting member 130 may include nitride, oxynitride, an amorphous material, etc. For example, the supporting member 130 may include silicon nitride, silicon oxide, amorphous silicon, amorphous carbon, etc. In an example embodiment, the supporting member 130 may include a material substantially the same as or substantially similar to that of the etch-stop layer 110. Alternatively, the supporting member 130 and the etch-stop layer 110 may include different materials, respectively.

In example embodiments of the inventive concept, the supporting member 130 may have a shape of a line or a bar. The supporting member 130 may be positioned between the adjacent third conductive patterns 125 along a first direction and/or a second direction substantially parallel to the substrate 100. Here, the first direction may be substantially perpendicular to the second direction. For example, the supporting member 130 may be located between the adjacent third conductive patterns 125 along an X-axis and/or a Y-axis.

In some example embodiments of the inventive concept, since the electrode structure having the first to the third conductive patterns 115, 120 and 125 ensures the improved structural stability, the structure of the capacitor may be simplified without requiring the supporting member 130 between the adjacent third conductive patterns 125.

The dielectric layer 150 is disposed on the supporting member 130 and the etch-stop layer 110 to cover the electrode structure. The dielectric layer 150 may be formed uniformly along profiles of the supporting member 130, the third conductive pattern 125 and the second conductive pattern 120. The dielectric layer 150 may include nitride and/or metal oxide. The dielectric layer 150 may have a multi layer structure or a single layer structure. When the supporting member 130 has a bar shape or line shape, the dielectric layer 150 may be formed uniformly to cover the supporting member 130, the second and the third conductive patterns 120 and 125.

The upper electrode 160 is located on the dielectric layer 150. The upper electrode 160 may be formed on the dielectric layer 150 to fill a gap between the adjacent electrode structures. For example, the upper electrode 160 may have a shape of a plate. The upper electrode 160 may include metal, metal compound and/or polysilicon. The upper electrode 160 may be formed uniformly on the dielectric layer 150 along a profile of the dielectric layer 150.

FIGS. 7A to 7E are cross-sectional views illustrating a method of manufacturing a capacitor having an electrode structure in accordance with some example embodiments of the inventive concept. The capacitor manufactured by the method illustrated in FIGS. 7A to 7E may have a construction substantially the same as or substantially similar to that of the capacitor described with reference to FIG. 6.

Figure 7A:
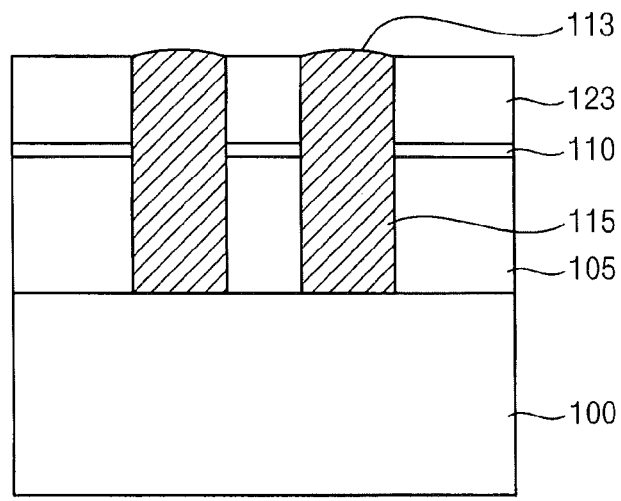
FIGS. 7A to 7E are cross-sectional views illustrating a method of manufacturing a capacitor having an electrode structure in accordance with example embodiments of the inventive concept.

Referring to FIG. 7A, an insulation layer 105 and an etch-stop layer 110 are formed on a substrate 100. A process for forming the insulation layer 105 may be substantially the same as or substantially similar to the process described with reference to FIG. 2A. The etch-stop layer 110 may be formed using a material that has an etching selectivity relative to the insulation layer 105 by a CVD process, an ALD process, a PECVD process, an LPCVD process, a sputtering process, a vacuum evaporation process, etc. For example, the etch-stop layer 110 may be formed using nitride, oxynitride, metal oxide, etc.

A first sacrificial layer 123 is formed on the etch-stop layer 110. The first sacrificial layer 123 is formed using a material substantially the same as or substantially similar to that of the insulation layer 105. For example, when the insulation layer 105 is formed using oxide, the first sacrificial layer 123 may be formed using oxide whereas the etch-stop layer 110 may be formed using nitride or oxynitride. The first sacrificial layer 123 may be formed on the etch-stop layer 110 by a CVD process, a PECVD process, an LPCVD process, an HDP-CVD process, etc.

After a first mask (not illustrated) is formed on the first sacrificial layer 123, the first sacrificial layer 123, the etch-stop layer 110 and the insulation layer 105 are partially etched using the first mask as an etching mask. Thus, a first opening (not illustrated) is formed through the insulation layer 105 to expose a predetermined portion of the substrate 100 (for example, a contact region).

A first conductive layer (not illustrated) is formed on the first sacrificial layer 123 to fill the first opening. The first conductive layer may be formed using a material that easily expands in volume to a desired level. For example, the first conductive layer may be formed on the first sacrificial layer 123 using metal such as tungsten, ruthenium, indium, etc., by a sputtering process, an ALD process, a CVD process, a PLD process, a vacuum deposition process, etc.

A preliminary first conductive pattern 113 is formed to fill the first opening by partially removing the first conductive layer until the first sacrificial layer 123 is exposed. Detailed processes for forming the preliminary first conductive pattern 113 are substantially the same as or substantially similar to those described with reference to FIG. 2B or FIG. 5A.

Figure 7B:
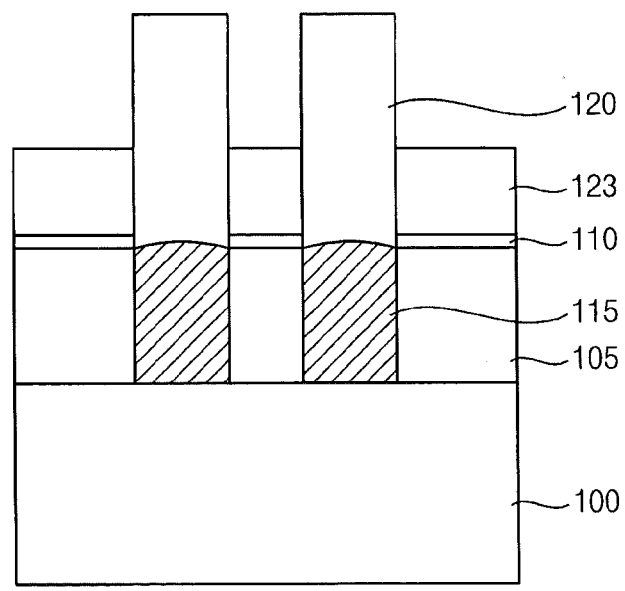

Referring to FIG. 7B, a second conductive pattern 120 is formed by growing metal oxide from the preliminary first conductive pattern 113 by an oxidation process, while changing the preliminary first conductive pattern 113 into a first conductive pattern 115. A lower portion of the second conductive pattern 120 may be buried in the first sacrificial layer 123, and an upper portion of the second conductive pattern 120 may protrude over the first sacrificial layer 123. The oxidation process for forming the first and the second conductive patterns 115 and 120 may be substantially the same as or substantially similar to the oxidation process described with reference to FIG. 2C.

Figure 7C:
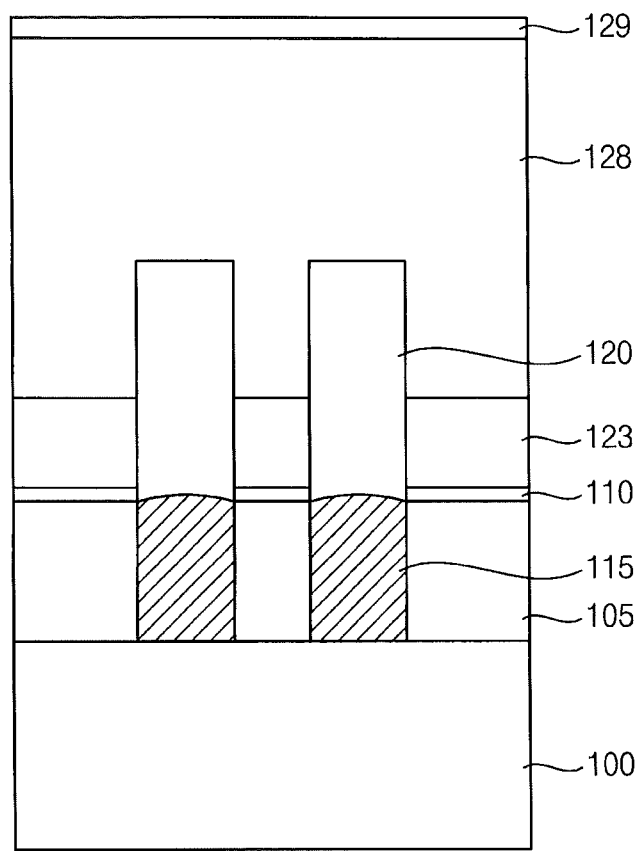

Referring to FIG. 7C, a second sacrificial layer 128 is formed on the first sacrificial layer 123 to cover the second conductive pattern 120. The second sacrificial layer 128 may have a thickness sufficiently covering the second conductive pattern 120 considering a total height of the electrode structure. Because the total height of the electrode structure mainly depends on thicknesses of the first and the second sacrificial layers 123 and 128, the height of the electrode structure may be controllable by adjusting the thicknesses of the first and the second sacrificial layers 123 and 128.

The second sacrificial layer 128 may be formed using a material substantially the same as or substantially similar to that of the first sacrificial layer 123 and/or that of the insulation layer 105. For example, the second sacrificial layer 128 may be formed on the first sacrificial layer 123 using oxide, nitride or oxynitride by a CVD process, a PECVD process, an LPCVD process, an HDP-CVD process, etc.

A supporting layer 129 is formed on the second sacrificial layer 128. The supporting layer 129 may be formed using a material that has an etching selectivity with respect to the second sacrificial layer 128, the first sacrificial layer 123 and/or the insulation layer 105. For example, the supporting layer 129 may be formed using a material substantially the same as or substantially similar to that of the etch-stop layer 110. Additionally, the supporting layer 129 may be formed by a process substantially the same as or substantially similar to the process for forming the etch-stop layer 110.

Figure 7D:
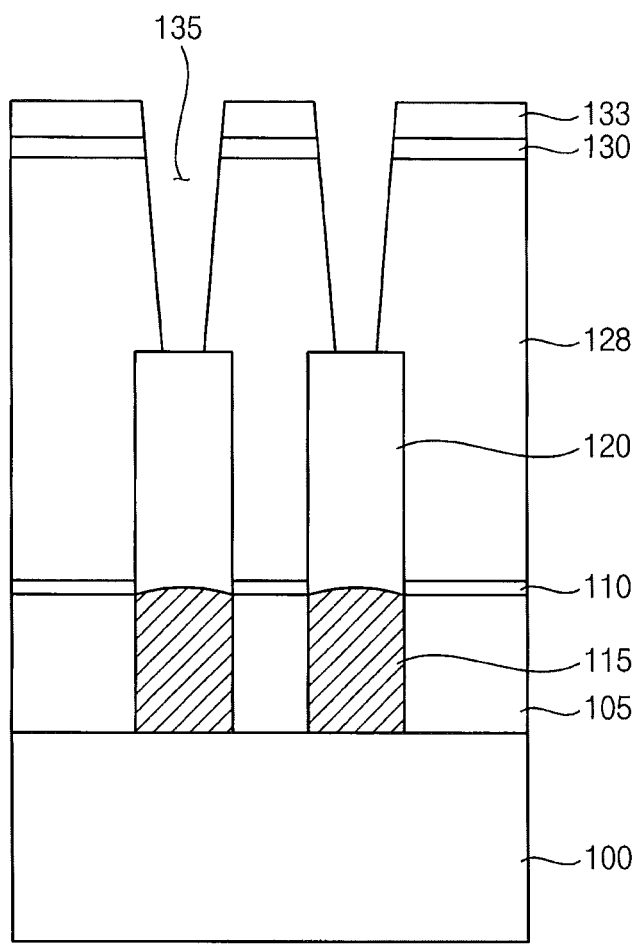

Referring to FIG. 7D, a second mask 133 is formed on the supporting layer 129. The supporting layer 129 and the second sacrificial layer 128 are partially removed using the second mask as an etching mask. Hence, a second opening 135 is formed to expose the second conductive pattern 120. For example, the second opening 135 may expose at least a portion of the second conductive pattern 120.

When the second opening 135 is formed in the second sacrificial layer 128, the supporting layer 129 is changed into a supporting member 130. Further, a structure of a third conductive pattern subsequently formed may depend on a shape of the second opening 135. In example embodiments of the inventive concept, the second opening 135 may have various three-dimensional structures, such as a substantially circular cylinder, a substantially elliptical cylinder, a substantially polygonal cylinder, etc. The second opening may have an upper width substantially greater than a lower width.

Figure 7E:
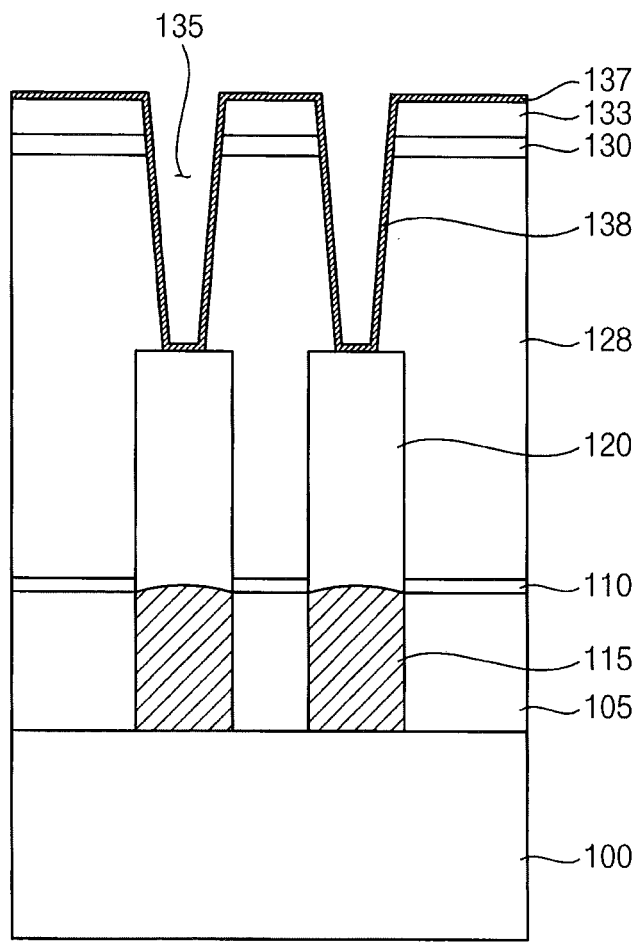

Referring to FIG. 7E, a second conductive layer 137 is formed on the exposed second conductive pattern 120, a sidewall of the second opening 135 and the second mask 133. The second conductive layer 137 may be formed uniformly along a profile of the second opening 135. The second conductive layer 137 may be formed using metal, metal compound and/or polysilicon by a sputtering process, an ALD process, a vacuum deposition process, a CVD process, a PECVD process, a PLD process, etc. For example, the second conductive layer 137 may be formed using tungsten, titanium, tantalum, molybdenum, iridium, hafnium, zirconium, ruthenium, platinum, nickel, aluminum, copper, tungsten nitride, aluminum nitride, tantalum nitride, polysilicon doped with impurities, etc. These may be used alone or in a combination thereof.

The third conductive pattern (not illustrated) is formed in the second opening 135 by partially removing the second conductive layer 137 until the second mask 133 is exposed. The third conductive pattern may be formed by a CMP process. The third conductive pattern may have a structure substantially the same as or substantially similar to that of the third conductive pattern 125 described with reference to FIG. 6.

After removing the second mask 133, the first and the second sacrificial layer 123 and 128 are removed from the second conductive pattern 120 and the third conductive pattern. Thus, an electrode structure having a structure substantially the same as or substantially similar to that of the electrode structure described with reference to FIG. 6 may be obtained. The first and the second sacrificial layers 123 and 128 may be removed using an etching gas or an etching solution including hydrogen fluoride or phosphoric acid in accordance with the materials included in the first and the second sacrificial layers 123 and 128. When the first and the second sacrificial layers 123 and 128 are removed, the supporting member 130 remains between adjacent third conductive patterns.

When a dielectric layer (not illustrated) and an upper electrode (not illustrated) are formed on the supporting member 130, the third conductive pattern, the second conductive pattern 120 and the etch-stop layer 110, a capacitor having a structure substantially the same as or substantially similar to that of the capacitor described with reference to FIG. 6 may be provided on the substrate 100. The dielectric layer may be formed using nitride and/or metal oxide, and the upper electrode may be formed using polysilicon, metal and/or metal compound.

In some example embodiments of the inventive concept, a resistance of the second conductive pattern 120 may be controlled to a desired level by performing a reduction process on the second conductive pattern 120 of which resistance is relatively greater than that of the first conductive pattern 115. For example, the reduction process for the second conductive pattern 120 may include a heat treatment process performed under an atmosphere containing hydrogen ($H_2$) or ammonia ($NH_3$).

In a reduction process executed under an atmosphere containing hydrogen, the mechanism for removing oxygen may be represented by the following equation (1).

$$M_xO_y + yH_2 \rightarrow yH_2O + xM \quad (1)$$

The table below denotes resistances of the first and the second conductive patterns according to the reduction processes. In the following table, Sample 1 includes a plurality of second conductive patterns formed on a wafer without performing a reduction process, and Sample 2 includes second conductive patterns formed on a wafer by performing a reduction process under an atmosphere including hydrogen. Sample 3 includes second conductive pattern formed on a wafer by performing a reduction process under an atmosphere containing ammonia, and Sample 4 includes first conductive pattern formed on wafer without any reduction process. The second and first conductive patterns include tungsten oxide and tungsten, respectively.

TABLE

| | Resistance [Ω·cm] | | | | | |
|---|---|---|---|---|---|---|
| | average | T | C | B | L | R |
| Sample 1 | 252 | 253 | 252 | 250 | 252 | 252 |
| Sample 2 | 147 | 148 | 148 | 147 | 148 | 147 |
| Sample 3 | 167 | 166 | 168 | 168 | 167 | 166 |
| Sample 4 | 119 | 120 | 120 | 118 | 118 | 120 |

In the above table, "T" indicates the resistances of the conductive patterns positioned on an upper portion of the wafer, "C" represents the resistances of the conductive patterns located at a central portion of the wafer, and "B" denotes the resistances of the conductive patterns formed on a lower portion of the water. "L" and "R" represent resistances of the conductive patterns positioned at the left portion of the wafer and at the right portion of the wafer, respectively.

As shown in the table, the second conductive patterns without the reduction process (Sample 1) have relatively high average resistances of about 252Ω·cm, whereas the first conductive patterns including tungsten (Sample 4) have average resistances of about 119Ω·cm. However, the average resistance of the second conductive patterns reduced under the atmosphere including ammonia (Sample 3) is about 167Ω·cm, which is decreased considerably. Particularly, the average resistance of the second conductive patterns reduced under an atmosphere including hydrogen (Sample 2) is about 147Ω·cm, which is decreased greatly to reach almost that of the first conductive patterns (Sample 1). Thus, the resistances of the second conductive patterns including metal oxide may be controlled to a desirable level by the reduction process.

Figure 8:
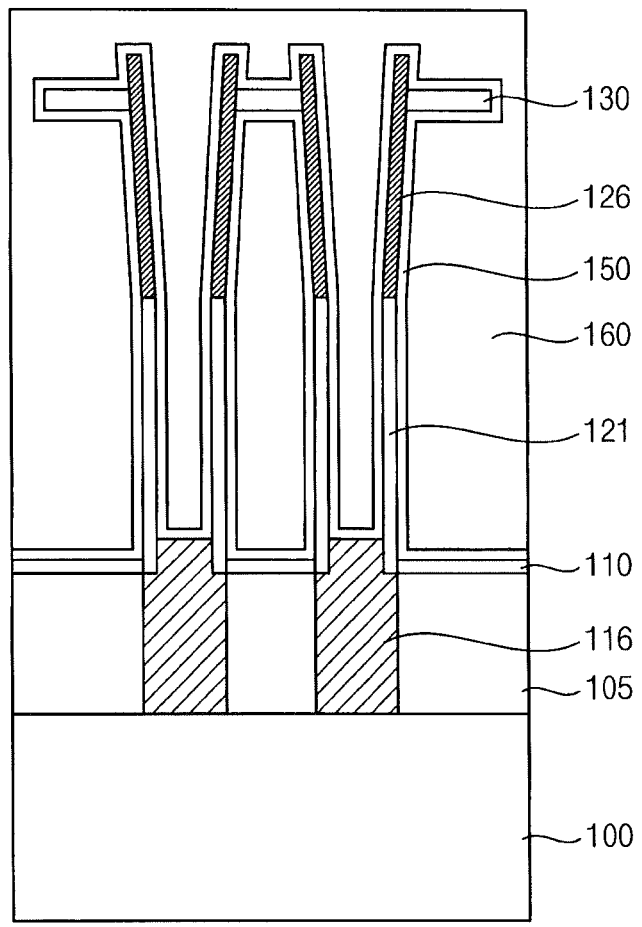

FIG. 8 is a cross-sectional view illustrating a capacitor including an electrode structure in accordance with some example embodiments of the inventive concept.

Referring to FIG. 8, the capacitor includes the electrode structure having a first conductive pattern 116, a second conductive pattern 121, a third conductive pattern 126, a supporting member 130, a dielectric layer 150 and an upper electrode 160. The first conductive pattern 116 may be electrically connected to a predetermined region of a substrate 100, and the second conductive pattern 121 may extend from an upper lateral portion of the first conductive pattern 116. The third conductive pattern 126 may extend from the second conductive pattern 121.

As for the capacitor illustrated in FIG. 8, the substrate 100, an insulation layer 105, an etch-stop layer 110 and the supporting member 130 are substantially the same as or substantially similar to those described with reference to FIG. 6. Further, the first and the second conductive patterns 116 and 121 of the electrode structure in FIG. 8 may have structures substantially the same as or substantially similar to those of the first and the second conductive patterns 60 and 65 described with reference to FIG. 3. That is, the second conductive pattern 121 may have a three-dimensional structure such as a substantially circular cylinder shape, a substantially elliptical cylinder shape, a substantially polygonal cylinder shape, etc. By controlling process conditions of an oxidation process, a height of the second conductive pattern 121 may be increased, and thus the first conductive pattern 116 may not have a convex upper face.

The third conductive pattern 126 may extend from the second conductive pattern 121 in a direction substantially perpendicular to the substrate 100. The third conductive pattern 126 may have a substantially cylindrical structure of which an upper width is substantially less than a lower width. For example, the third conductive pattern 126 may have a substantially circular cylinder shape, a substantially elliptical cylinder shape, a substantially polygonal cylinder shape, etc. In example embodiments of the inventive concept, a lower portion of the third conductive pattern 126 may have a width substantially the same as or substantially similar to that of the second conductive pattern 121. The third conductive pattern 126 may include a material substantially the same as or substantially similar to that of the third conductive pattern 125 described with reference to FIG. 6.

Figure 9A:
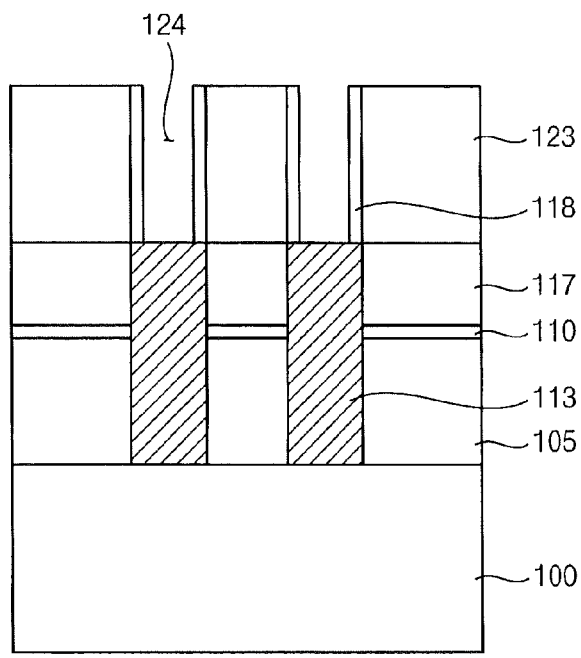
FIGS. 9A to 9C are cross-sectional views illustrating a method of manufacturing a capacitor including an electrode structure in accordance with example embodiments of the inventive concept.
Figure 9B:
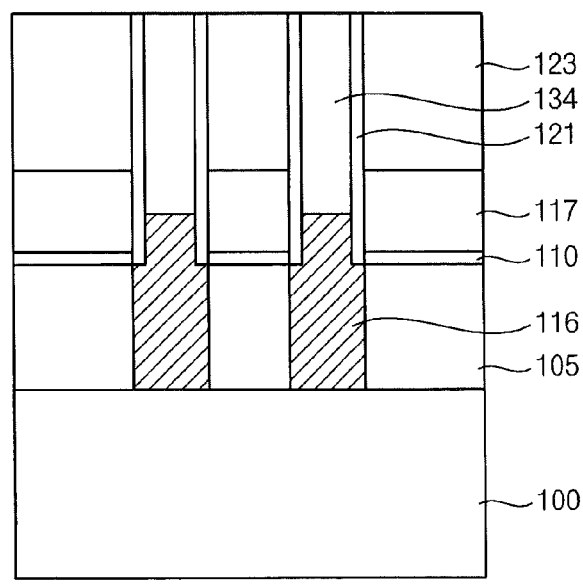
Figure 9C:
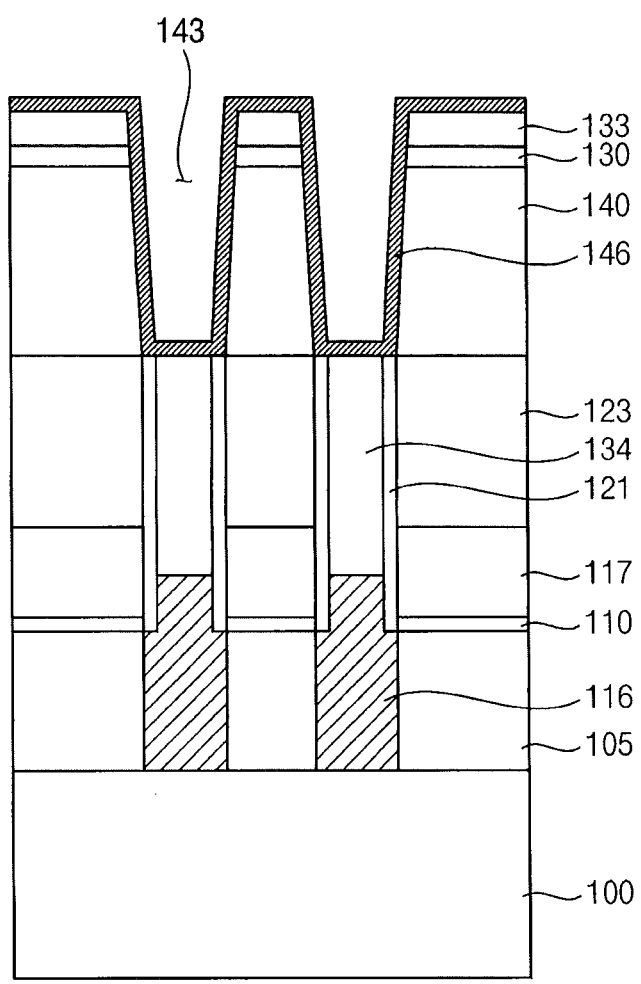

FIGS. 9A to 9C are cross-sectional views illustrating a method of manufacturing a capacitor including an electrode structure in accordance with some example embodiments of the inventive concept.

Referring to FIG. 9A, an insulation layer 105, an etch-stop layer 110, and a first sacrificial layer 117 are formed on a substrate 100 by performing processes substantially the same as or substantially similar to those described with reference to FIG. 7A. Further, a process for forming a first opening (not illustrated) through the first sacrificial layer 117, the etch-stop layer 110, and the insulation layer 105, and a process for forming a preliminary first conductive pattern 113 in the first opening may be substantially the same as or substantially similar to processes described with reference to FIG. 7A.

After a second sacrificial layer 123 is formed on the first sacrificial layer 117, a second opening 124 is formed through the second sacrificial layer 123 by partially etching the second sacrificial layer 123. The second opening 124 exposes the preliminary first conductive pattern 113. The second sacrificial layer 123 may be formed using a material substantially the same as or substantially similar to those of the first sacrificial layer 117 and/or the insulation layer 105.

A first sacrificial pattern 118 is formed on a sidewall of the second opening 124. The first sacrificial pattern 118 may be formed by performing processes substantially the same as or substantially similar to those described with reference to FIG. 5A.

Referring to FIG. 9B, a second sacrificial pattern 134 is formed on the preliminary first conductive pattern 113 to fill the second opening 124, and then a third opening (not illustrated) is formed by removing the first sacrificial pattern 118. The third opening partially exposes the preliminary first conductive pattern 113. The second and the first sacrificial patterns 134 and 118 may be removed by processes substantially the same as or substantially similar to those described with reference to FIG. 5B.

A second conductive pattern 121 is formed from the preliminary first conductive pattern 113 to fill the third opening, while the preliminary first conductive pattern 113 is changed into the first conductive pattern 116 through processes substantially the same as or substantially similar to those described with reference to FIG. 5C. In example embodiments of the inventive concept, the first conductive pattern 116 may protrude over an upper portion of the etch-stop layer 110, and the second conductive pattern 121 may protrude from an upper lateral portion of the first conductive pattern 116 in a direction substantially perpendicular to the substrate 100.

Referring to FIG. 9C, a third sacrificial layer 140 and a supporting layer (not illustrated) are sequentially formed on the second sacrificial layer 123, the second conductive pattern 121 and the second sacrificial pattern 134. A process for forming the supporting layer may be substantially the same as or substantially similar to the process described with reference to FIG. 7C. The third sacrificial layer 140 may be formed using a material substantially the same as or substantially similar to those of the first sacrificial layer 117, the second sacrificial layer 123, and/or the insulation layer 105. For example, the third sacrificial layer 140 may be formed using oxide by a CVD process, a PECVD process, a LPCVD process, a spin coating process, a HDP-CVD process, etc.

A mask 133 is formed on the supporting layer. The supporting layer and the third sacrificial layer 140 are partially removed using the mask 133 as an etching mask, so that a fourth opening 143 is formed through the supporting layer and the third sacrificial layer 140. The fourth opening 143 exposes the second conductive pattern 121 and the second sacrificial pattern 134. By forming the fourth opening 143, a supporting member 130 is provided from the supporting layer.

A conductive layer 146 is formed on a sidewall and a bottom of the fourth opening 143 and the mask 133. The conductive layer 146 may be formed by a process substantially the same as or substantially similar to the process for forming the second conductive layer 137 described with reference to FIG. 7E.

A portion of the conductive layer 146 and the mask 133 are removed. By sequentially removing the third, the second and the first sacrificial layers 140, 123 and 117 and the second sacrificial pattern 134, the electrode structure having a structure substantially the same as or substantially similar to that of the electrode structure illustrated in FIG. 8 may be provided on the substrate 100. When the second sacrificial pattern 134 is removed, the conductive layer 146 remaining on the second conductive pattern 134 is also removed, thereby forming the supporting member 130 between adjacent third conductive patterns.

A dielectric layer (not illustrated) and an upper electrode (not illustrated) are sequentially formed on the electrode structure and the etch-stop layer 110, and thus a capacitor is formed on the substrate 100. The capacitor may have a structure substantially the same as or substantially similar to that of the capacitor described with reference to FIG. 8.

Figure 10:
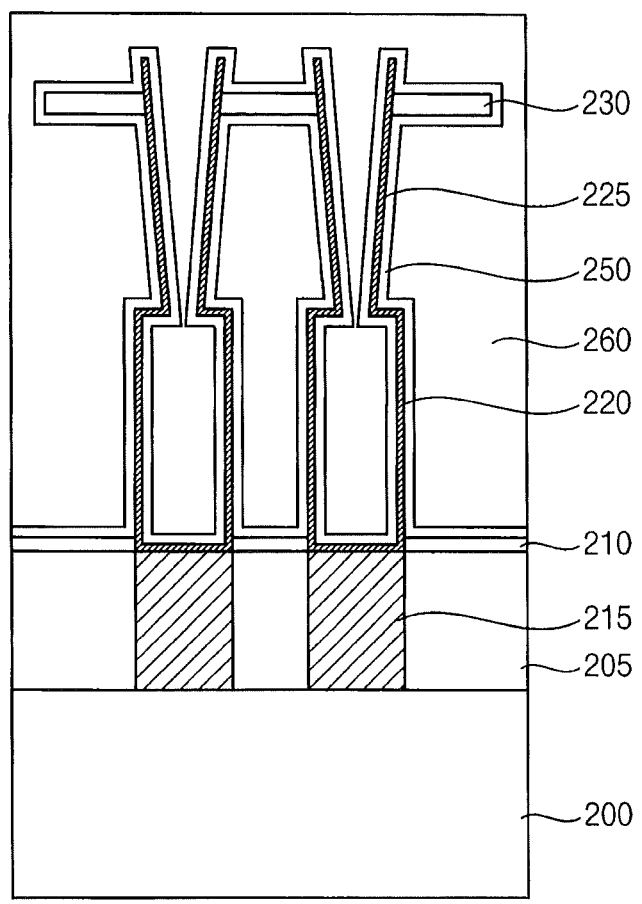

FIG. 10 is a cross-sectional view illustrating a capacitor including an electrode structure in accordance with some example embodiments of the inventive concept.

Referring to FIG. 10, the capacitor includes the electrode structure disposed on a substrate 200, a dielectric layer 250, and an upper electrode 260. The electrode structure includes a first conductive pattern 215 contacting the substrate 200, a second conductive pattern 220 disposed on the first conductive pattern 215, and a third conductive pattern 225 extending from the second conductive pattern 220. In example embodiments of the inventive concept, the second and the third conductive patterns 220 and 225 may be formed integrally.

The first conductive pattern 215 of the electrode structure may be buried in an insulation layer 205 provided on the substrate 200. An etch-stop layer 210 is positioned on the insulation layer 205. The first conductive pattern 215 may be electrically connected to a conductive region of the substrate 200 such as an impurity region or a diffusion region.

The second conductive pattern 220 may have a structure of a substantially circular cylinder, a substantially elliptical cylinder or a substantially polygonal cylinder. The third conductive pattern 225 extending from the second conductive pattern 220 may have a substantially cylindrical shape. In example embodiments of the inventive concept, the second conductive pattern 220 and the third conductive pattern 225 may include substantially the same material. For example, the second conductive pattern 220 may include a conductive material without metal oxide generated from metal in the first conductive pattern 215. The second and third conductive patterns 220 and 225 may be formed integrally. Here, the third conductive pattern 225 may have a width of a lower portion substantially less than that of an upper portion thereof. The width of the upper portion of the third conductive pattern 225 may be substantially the same as the width of the second conductive pattern 220. A supporting member 230 is located between adjacent third conductive patterns 225, thereby improving the structural stability of the electrode structure.

The dielectric layer 250 is formed uniformly along profiles of the second and the third conductive patterns 220 and 225, the supporting member 230 and the etch-stop layer 210. The upper electrode 260 is disposed on the dielectric layer 250. The upper electrode 260 may have a shape of a plate. Alternatively, the upper electrode 260 may have a uniform thickness along a profile of the dielectric layer 250.

Figure 11A:
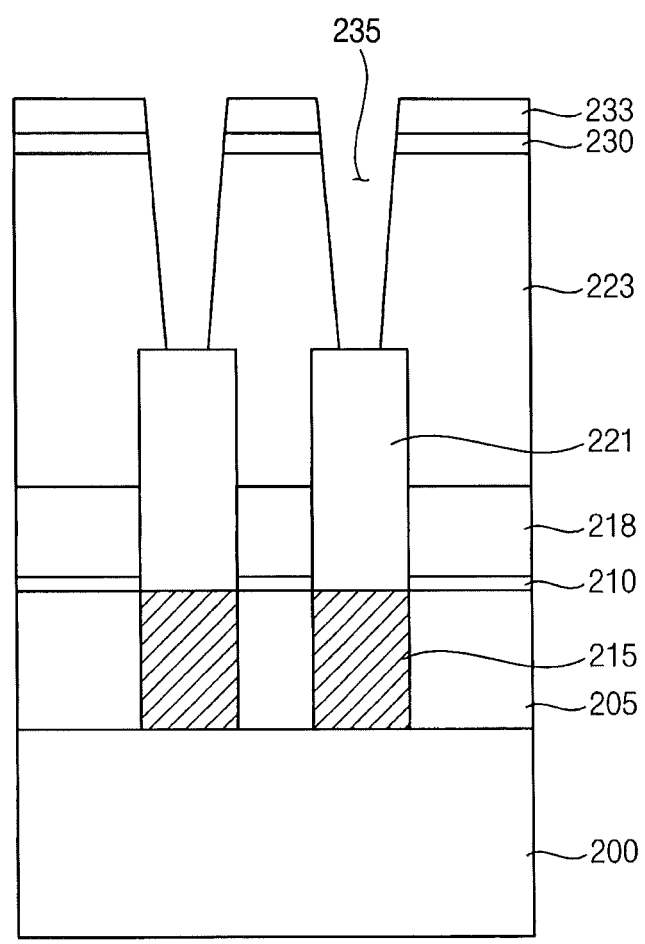
FIGS. 11A to 11B are cross-sectional views illustrating a method of manufacturing a capacitor including an electrode structure in accordance with example embodiments of the inventive concept.
Figure 11B:
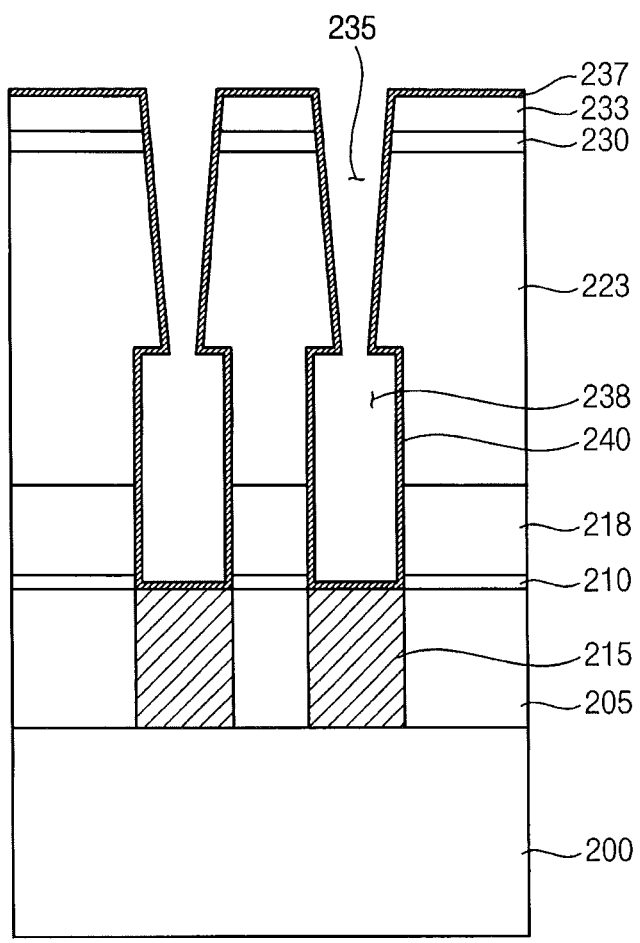

FIGS. 11A to 11B are cross-sectional views illustrating a method of manufacturing a capacitor including an electrode structure in accordance with some example embodiments of the inventive concept.

Referring to FIG. 11A, an insulation layer 205, an etch-stop layer 210, a first sacrificial layer 218, a first conductive pattern 215, a sacrificial conductive pattern 221, and a second sacrificial layer 223 are formed on a substrate 200 by performing processes substantially the same as or substantially similar to those described with reference to FIGS. 7A to 7D. The sacrificial conductive pattern 220 may be formed from the first conductive pattern 215 by a process substantially the same as or substantially similar to the process forming the second conductive pattern 120 described with reference to FIG. 7B. Thus, the sacrificial conductive pattern 221 may include metal oxide obtained by an oxidation process.

A supporting layer (not illustrated) and a mask 233 are formed on the second sacrificial layer 223. The supporting layer and the second sacrificial layer 223 are partially removed to thereby form a supporting member 230 and a first opening 235 exposing a portion of the sacrificial conductive pattern 221.

Referring to FIG. 11B, a second opening 238 connecting to the first opening 235 is formed by removing the sacrificial conductive pattern 221 exposed through the first opening 235. The second opening 238 exposes the first conductive pattern 215. When the second opening 238 is formed, the second sacrificial layer 223 and the first sacrificial layer 218 corresponding to a sidewall of the second opening 238 may also be exposed.

A conductive layer 237 is formed on the exposed first conductive pattern 215, the sidewall of the second opening 238, a sidewall of the first opening 235, and the mask 233. The conductive layer 237 may be formed by a process substantially the same as or substantially similar to that described with reference to FIG. 7E.

By removing the mask 233 and a portion of the conductive layer 237 until the supporting member 230 is exposed, second and third conductive patterns (not illustrated) are formed. The second and the third conductive patterns may have a structure substantially the same as or substantially similar to the second and the third conductive patterns 220 and 225 described with reference to FIG. 10. For example, the third conductive pattern may correspond to a remaining portion of the conductive layer 237 on the sidewall of the first opening 235, and the second conductive pattern may correspond to remaining portions of the third conductive layer 237 on the first conductive pattern 215 and the sidewall of the second opening 238.

After forming the second and the third conductive patterns, the first and the second sacrificial layer 218 and 223 are etched to form the electrode structure on the substrate 200. The electrode structure may have a construction substantially the same as or substantially similar to that of the electrode structure described with reference to FIG. 10.

After a dielectric layer (not illustrated) is formed uniformly on the second and the third conductive patterns, the supporting member 230 and the etch-stop layer 210, an upper electrode (not illustrated) are formed on the dielectric layer so that the capacitor is provided on the substrate 200. The capacitor may have a structure substantially the same as or substantially similar to that of the capacitor described with reference to FIG. 10.

Figure 12:
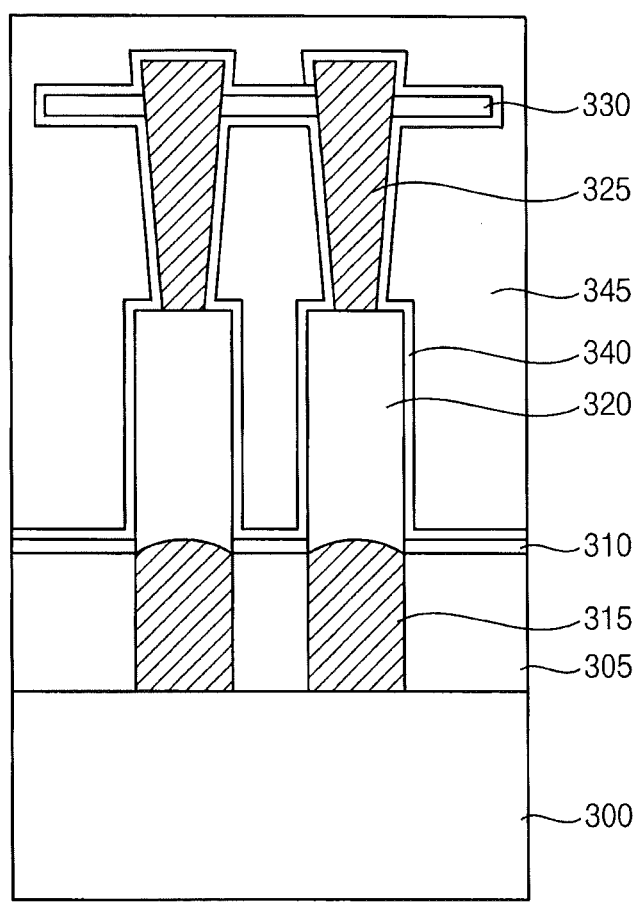

FIG. 12 is a cross-sectional view illustrating a capacitor including an electrode structure in accordance with some example embodiments of the inventive concept.

Referring to FIG. 12, the capacitor includes the electrode structure having a first conductive pattern 315, a second conductive pattern 320 and a third conductive pattern 325. The capacitor further includes a dielectric layer 340 covering the electrode structure and an upper electrode 345 disposed on the dielectric layer 340.

The electrode structure includes the first conductive pattern 315 disposed on a substrate 300, the second conductive pattern 320 extending from the first conductive pattern 315, and the third conductive pattern 325 located on the second conductive pattern 320.

A supporting member 330 is positioned between adjacent third conductive patterns 325. The first conductive pattern 315 may be buried in an insulation layer 305 formed on the substrate 300. An etch-stop layer 310 is located on the insulation layer 305. The dielectric layer 340 and the upper electrode 345 are sequentially formed on the etch-stop layer 310 to cover the electrode structure.

The first and the second conductive patterns 315 and 325 may have structures substantially the same as or substantially similar to those of the first and the second conductive patterns 115 and 120 described with reference to FIG. 6. The third conductive pattern 325 may have a substantially circular cylinder shape, a substantially elliptical cylinder shape or a substantially polygonal cylinder shape, etc. The third conductive pattern 325 may include a lower portion having a width substantially less than that of an upper portion thereof. Namely, the third conductive pattern 325 may have a sloped sidewall. Further, the width of the lower portion of the third conductive pattern 325 may be substantially less than a width of the second conductive pattern 220.

The dielectric layer 340 is disposed on the etch-stop layer 310 to cover the second and the third conductive patterns 320 and 325 of the electrode structure. For example, the dielectric layer 340 may have a substantially uniform thickness on the third conductive pattern 325, the second conductive pattern 320, and the etch-stop layer 310.

The upper electrode 345 is located on the dielectric layer 340. The upper electrode 345 may have a shape of a plate that fills a gap between adjacent electrode structures, or may have a uniform thickness along a profile of the dielectric layer 340.

Figure 13:
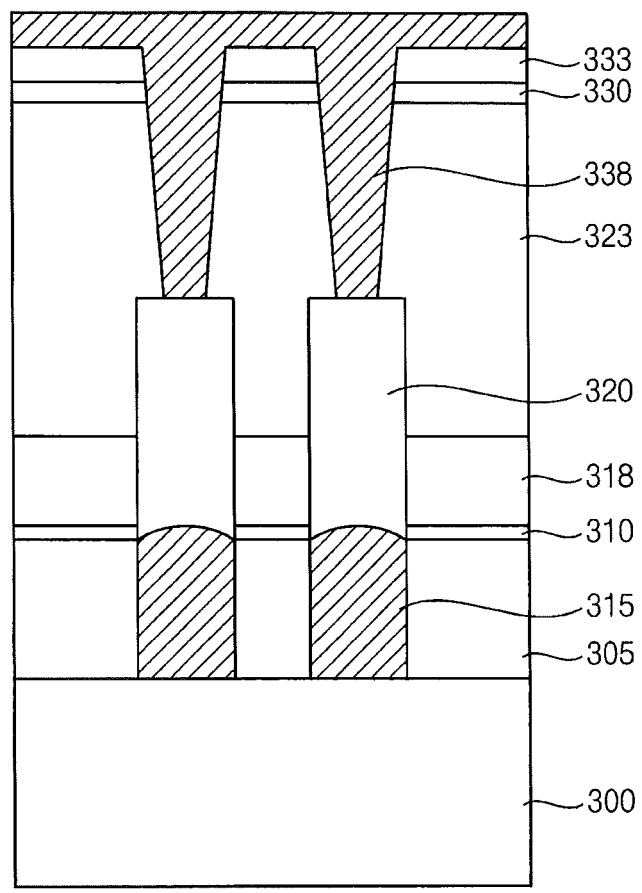

FIG. 13 is a cross-sectional view illustrating a method of manufacturing a capacitor including an electrode structure in accordance with some example embodiments of the inventive concept. The capacitor manufactured by the method in FIG. 13 may have a construction substantially the same as or substantially similar to that of the capacitor described with reference to FIG. 12.

Referring to FIG. 13, an insulation layer 305, an etch-stop layer 310, a first conductive pattern 315, a first sacrificial layer 318, a second conductive pattern 320, a second sacrificial layer 323, a supporting member 330, and a mask 333 are formed on a substrate 300 by performing processes substantially the same as or substantially similar to those described with reference to FIGS. 7A to 7D.

A conductive layer 338 is formed on the mask 333 to fill an opening (not illustrated) exposing the second conductive pattern 320. The conductive layer 338 may sufficiently fill the opening. That is, the conductive layer 338 may completely fill up the opening and may have a predetermined thickness based on an upper face of the mask 333.

After partially removing the conductive layer 338 until the mask 333 is exposed, the mask 333 is removed to form the electrode structure having a construction substantially the same as or substantially similar to that of the electrode structure described with reference to FIG. 12.

After a dielectric layer (not illustrated) is formed uniformly on the etch-stop layer 310 to enclose the second conductive pattern 320 and a third conductive pattern, an upper electrode (not illustrated) is formed on the dielectric layer. Thus, the capacitor is formed on the substrate 300. The capacitor may have a construction substantially the same as or substantially similar to that of the capacitor described with reference to FIG. 12.

Hereinafter, various semiconductor devices having electrode structures in accordance with example embodiments of the inventive concept and methods of manufacturing semiconductor devices will be described with reference to accompanying drawings.

Figure 14:
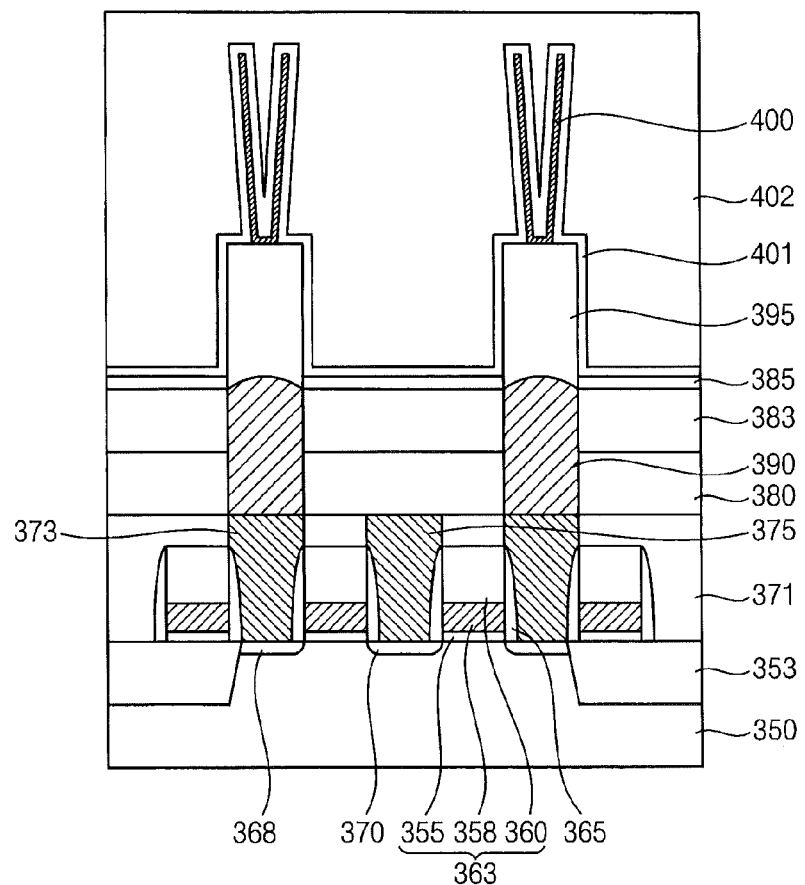

FIG. 14 is a cross-sectional view illustrating a semiconductor device including an electrode structure in accordance with some example embodiments of the inventive concept. The electrode structure of the semiconductor device illustrated in FIG. 14 may have a construction substantially the same as or substantially similar to the electrode structure described with reference to FIG. 6. However, various electrode structures described with reference to FIG. 8, 10 or 12 may be used in the semiconductor device.

Referring to FIG. 14, the semiconductor device includes a switching device provided on a substrate 350 and a capacitor including an electrode structure.

An isolation layer 353 is formed on the substrate 350. The isolation layer 353 may define an active region of the substrate 350 where the switching device is positioned. The switching device may include a first transistor having a channel region formed in the active region along a direction substantially parallel to the substrate 350. For example, the first transistor may include a metal oxide semiconductor (MOS) transistor.

In example embodiments of the inventive concept, the first transistor may include a gate structure 363, a first impurity region 368 and a second impurity region 370. The first and the second impurity regions 368 and 370 may be located at portions of the substrate 350 adjacent to the gate structure 361

The gate structure 363 includes a gate insulation layer pattern 355, a gate electrode 358 and a gate mask 360. A gate spacer 365 may be additionally formed on a sidewall of the gate structure 363. The first and the second impurity regions 368 and 370 may be positioned in the active region of the substrate 350 between adjacent gate structures 363. The channel region of the first transistor may be generated in the active region along a direction substantially parallel to the substrate 350.

A first insulating interlayer 371 covering the first transistor is disposed on the substrate 350. The first insulating interlayer 371 may be formed on the substrate 350 to electrically insulate adjacent first transistors from conductive patterns and wirings.

First and second plugs 373 and 375 are formed through the first insulating interlayer 371. The first and the second plugs 373 and 375 may make contact with the first and the second impurity regions 368 and 370, respectively. A bit line (not illustrated) is provided on the first insulating interlayer 371. The bit line may be electrically connected to the second impurity region 370 through the second plug 375. The bit line may have a structure substantially the same as or substantially similar to that of the gate structure 363.

A second insulating interlayer 380 covering the bit line is formed on the first insulating interlayer 371. A third insulating interlayer 383 covering the bit line is disposed on the second insulating interlayer 380, and an etch-stop layer 385 is located on the third insulating interlayer 381

An opening (not illustrated) is formed through the third and the second insulating interlayers 383 and 380. The opening exposes the first plug 373. A first conductive pattern 390 is disposed in the opening. A second conductive pattern 395 extends from the first conductive pattern 390 in a direction substantially parallel to the substrate 350. A third conductive pattern 400 is positioned on the second conductive pattern 395.

A dielectric layer 401 is located on the etch-stop layer 385 to cover the electrode structure including the first to the third conductive patterns 390, 395 and 400. An upper electrode 402 is provided on the dielectric layer 401.

Figure 15A:
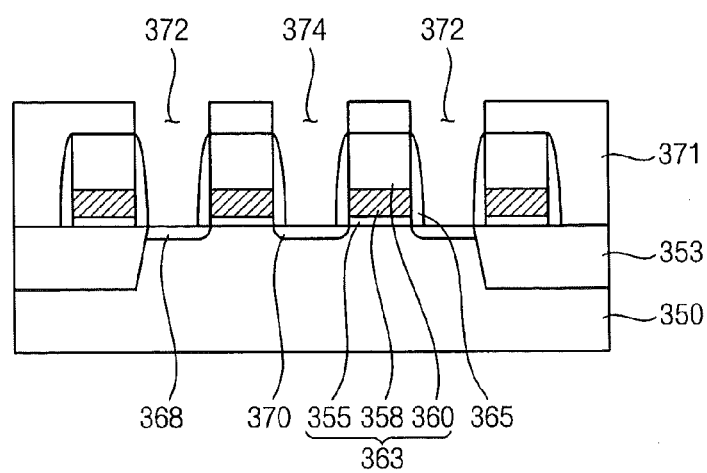
FIGS. 15A to 15C are cross-sectional views illustrating a method of manufacturing a semiconductor device including an electrode structure in accordance with example embodiments of the inventive concept.
Figure 15B:
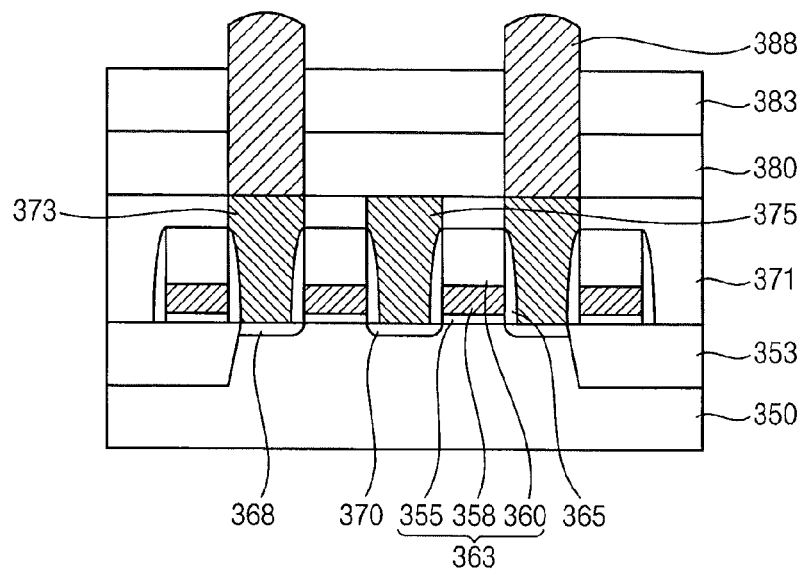
Figure 15C:
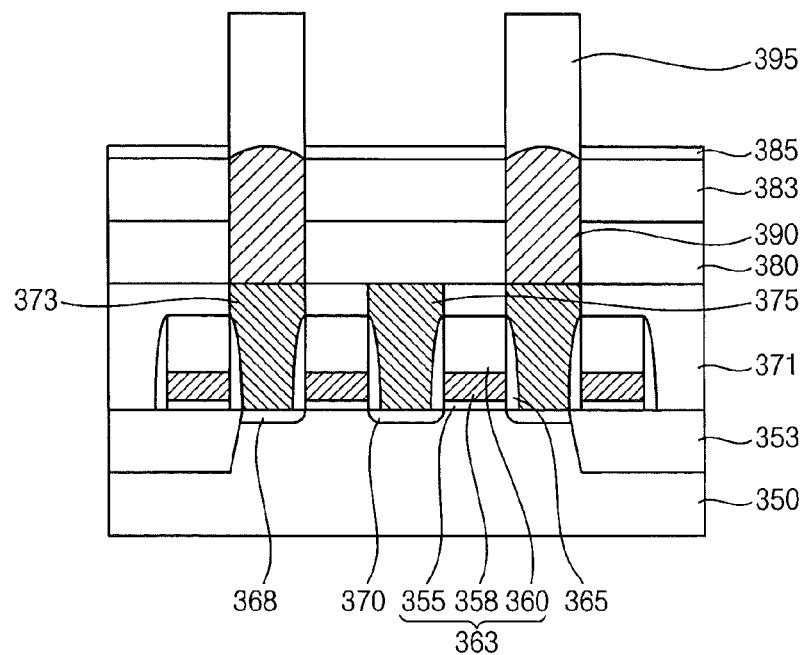

FIGS. 15A to 15C are cross-sectional views illustrating a method of manufacturing a semiconductor device including an electrode structure in accordance with example embodiments of the inventive concept.

Referring to FIG. 15, an active region and a field region of a substrate 350 are defined by forming an isolation layer 353 on the substrate 350. The substrate 350 may include a semiconductor substrate or a substrate having a semiconductor layer. The isolation layer 353 may be formed using oxide, such as silicon oxide. For example, the isolation layer 353 may be formed by an isolation process such as a shallow trench isolation (STI) process.

A gate insulation layer (not illustrated), a gate conductive layer (not illustrated), and a gate mask layer (not illustrated) are sequentially formed on the substrate 350 having the isolation layer 353. A gate structure 363 is formed on the substrate 350 by patterning the gate insulation layer, the gate conductive layer and the gate mask layer. The gate structure 363 includes a gate insulation layer pattern 355, a gate electrode 358 and a gate mask 360. The gate insulation layer pattern 355 may include silicon oxide and/or metal oxide, and the gate electrode 358 may include metal, metal compound and/or polysilicon. The gate mask 360 may include nitride, oxynitride, etc.

A gate spacer 360 is formed on a sidewall of the gate structure 363. The gate spacer 360 may be formed using silicon nitride or silicon oxynitride. A first impurity region 368 and a second impurity region 370 are formed in the active region exposed between adjacent gate structures 363. The first and the second impurity regions 368 and 470 may be formed by an ion implantation process using the gate spacer 360 and the gate structure 363 as implantation masks.

A first insulating interlayer 371 is formed on the substrate 350 to cover the gate structure 363 having the gate mask 360. The first insulating interlayer 371 may be formed using oxide such as silicon oxide. The first insulating interlayer 371 may be partially removed to form first and the second openings 372 and 374 that expose the first and the second impurity regions 368 and 370, respectively. For example, the first and the second openings 372 and 374 may be formed by an anisotropic etching process.

Referring to FIG. 15B, first and second plugs 373 and 375 are formed on the first and the second impurity regions 368 and 370 to fill the first and the second openings 372 and 374, respectively. The first and the second plugs 373 and 375 may be formed using metal and/or metal compound.

A bit line (not illustrated) is formed on the second plug 375. The bit line may include a bit line electrode, a bit line mask and a bit line spacer. The bit line may have a structure substantially similar to that of the gate structure 363.

A second insulating interlayer 380 covering the bit line is formed on the first and the second plugs 373 and 375 and the first insulating interlayer 371. The second insulating interlayer 380 may be formed using oxide such as silicon oxide. In example embodiments of the inventive concept, the second insulating interlayer 380 may be planarized until the bit line is exposed. For example, the second insulating interlayer 380 may be planarized by a CMP process and/or an etch-back process.

A third insulating interlayer 383 is formed on the second insulating interlayer 380. The third insulating interlayer 383 may be formed using a material substantially the same as or substantially similar to that of the first insulating interlayer 371 and/or that of the second insulating interlayer 380. A third opening (not illustrated) exposing the first plug 373 is formed through the third insulating interlayer 383 and the second insulating interlayer 380 by partially removing the third insulating interlayer 383 and the second insulating interlayer 380. For example, the second and the third insulating interlayers 380 and 383 may be partially removed to provide the third opening by an anisotropic etching process.

A preliminary first conductive pattern 388 is formed to fill the third opening. The preliminary first conductive pattern 388 may make contact with the first plug 373. The preliminary first conductive pattern 388 filling the third opening may protrude over the third insulating interlayer 383. The preliminary first conductive pattern 388 may be obtained by a process substantially the same as or substantially similar to the process described with reference to FIG. 2B or 7A.

Referring to FIG. 15C, a second conductive pattern 395 is formed from the preliminary first conductive pattern 388 while changing the preliminary first conductive pattern 388 into a first conductive pattern 390. An oxidation process for forming the first and the second conductive patterns 390 and 395 may be substantially the same as or substantially similar to the above-described process in accordance with various example embodiments of the inventive concept.

An etch-stop layer 385 is formed on the third insulating interlayer 383. The etch-stop layer 385 may be formed using a material having an etching selectivity with respect to the first to the third insulating interlayers 371, 380 and 383. For example, the etch-stop layer 385 may be formed using nitride, oxynitride, etc.

In example embodiments of the inventive concept, the electrode structure may be formed by processes substantially the same as or substantially similar to those described with reference to FIGS. 7C to 7E. The electrode structure may have a construction substantially the same as or substantially similar to the electrode structure described with reference to FIG. 14.

By sequentially forming a dielectric layer pattern (not illustrated) and an upper electrode (not illustrated) on the electrode structure and the etch-stop layer 385, a semiconductor device having the electrode structure is formed on the substrate 350. Here, the semiconductor device may have a construction substantially the same as or substantially similar to that of the semiconductor memory device illustrated in FIG. 14.

Figure 16:
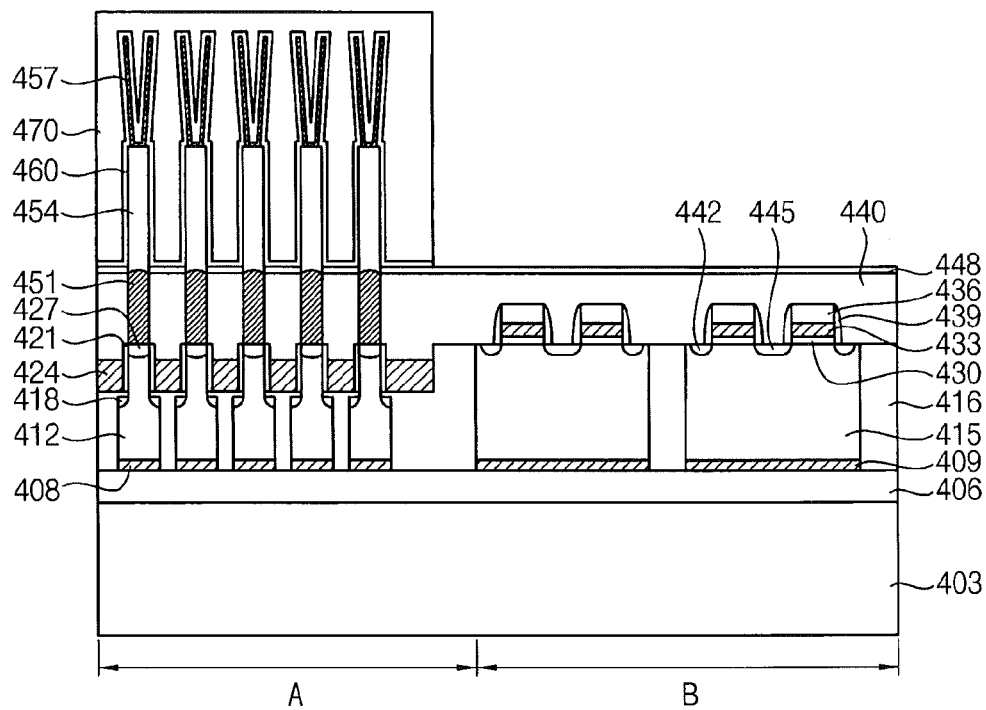

FIG. 16 is a cross-sectional view illustrating a semiconductor device including an electrode structure in accordance with example embodiments of the inventive concept. The electrode structure of the semiconductor device in FIG. 16 may have a construction substantially the same as or substantially similar to that of the electrode structure described with reference to FIG. 6, however, various electrode structures described with reference to FIG. 8, 10 or 12 may be used in the semiconductor device.

Referring to FIG. 16, the semiconductor device includes switching devices and electrode structures provided on a substrate 403. The switching devices may include first transistors formed in a first area A of the substrate 403 and second transistors provided in a second area B of the substrate 403.

The substrate 403 may include a substrate having a semiconductor layer. For example, the substrate 403 may include an SOI substrate, a GOI substrate, etc. The first area A of the substrate 403 may be a cell area where unit cells of the semiconductor device are formed, and the second area B of the substrate 403 may be a peripheral circuit area on which devices for controlling the unit cells are provided. The first transistor may have a channel region formed along a direction substantially perpendicular to the substrate 403, whereas the second transistor may have a channel region formed in a direction substantially parallel to the substrate 403.

A lower insulation layer 406 is formed on the substrate 403. A first wiring 408 and a second wiring 409 are formed on the lower insulation layer 406. The first and the second wirings 408 and 409 may be electrically connected to the switching devices. The first and the second transistors are formed on upper portions of the first and the second wirings 408 and 409, respectively. In example embodiments of the inventive concept, the first wiring 408 of the first area A may serve as a buried bit line for the unit cells of the semiconductor device.

The first transistor may include a first active pattern 412, a first gate insulation layer 421, a first gate electrode 424, a first impurity region 418 and a second impurity region 427.

The first gate electrode 424 may extend on the substrate 403 along a predetermined direction on the substrate 403. The first gate electrode 424 may cover an upper portion of the first active pattern 412. A channel region of the first transistor may be generated in the first active pattern 412 between the first and the second impurity regions 418 and 427 positioned substantially perpendicular to the substrate 403. That is, the first transistor may have a channel formed along a direction substantially perpendicular to the substrate 403.

The second transistor may be disposed on the second active pattern 415. The second transistor may include a second gate insulation layer pattern 430, a second gate electrode 433, a gate mask 436, a gate spacer 439, a third impurity region 442, and a fourth impurity region 445. A channel region of the second transistor may be formed in the second active pattern 415 between the third and the fourth impurity regions 442 and 445 positioned substantially parallel to the substrate 403. Namely, the second transistor may have a channel formed along a direction substantially parallel to the substrate 403.

A first insulating interlayer 416 is disposed on the substrate 403 to cover the second active pattern 415 and a lower portion of the first active pattern 412. A second insulating interlayer 440 is formed on the first insulating interlayer 416 to sufficiently cover the first and second transistors. An etch-stop layer 448 is positioned on the second insulating interlayer 440.

A first conductive pattern 451 of the electrode structure may pass through the etch-stop layer 448 and the second insulating interlayer 440, and the first conductive pattern 451 may make contact with the second impurity region 427 of the first transistor. A second conductive pattern 454 of the electrode structure may extend from the first conductive pattern 451. The second conductive pattern 454 may protrude over the etch-stop layer 448. A third conductive pattern 457 of the electrode structure may be disposed on the second conductive pattern 454.

A dielectric layer 460 is formed on the first area A of the substrate 403 to cover the third and the second conductive patterns 457 and 454 of the electrode structure. An upper electrode 470 is disposed on the dielectric layer 460.

FIGS. 17A to 17D are cross-sectional views illustrating a method of manufacturing a semiconductor device including an electrode structure in accordance with example embodiments of the inventive concept.

Figure 17A:
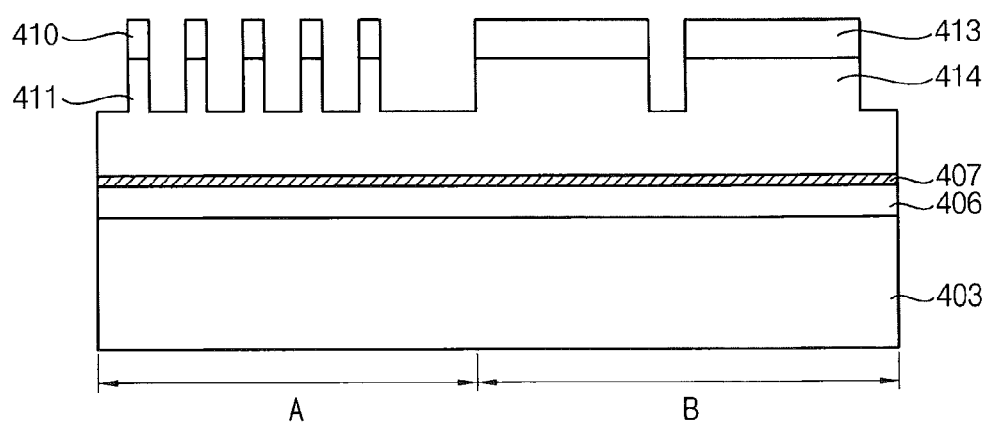
FIGS. 17A to 17D are cross-sectional views illustrating a method of manufacturing a semiconductor device including an electrode structure in accordance with example embodiments of the inventive concept.

Referring to FIG. 17A, a wiring layer 407 is formed on the substrate 403 having a semiconductor layer and a lower insulation layer 406. For example, the substrate 403 may include an SOI substrate or a GOI substrate that may have a semiconductor layer thereon. When the substrate 403 includes the SOI substrate or the GOI substrate, the wiring layer 407 may be formed between the semiconductor layer of the substrate 403 and the lower insulation layer 406.

The lower insulation layer 406 may be formed using oxide or nitride, and the wiring layer 407 may be formed using a conductive material such as metal, metal compound, and/or polysilicon. These may be used alone or in a combination thereof.

A mask layer (not illustrated) is formed on the semiconductor layer of the substrate 403. By etching the mask layer, a first mask 410 is provided in a first area A of the substrate 403 and a second mask 413 is formed in a second area B of the substrate 403. Each of the first and the second masks 410 and 413 may be formed using a material that has an etching selectivity relative to the semiconductor layer of the substrate 403. For example, the first and the second masks 410 and 413 may be formed using silicon nitride or silicon oxynitride. In example embodiments of the inventive concept, the second mask 413 may have a width substantially larger than that of the first mask 410. The first mask 410 may have various pillar structures such as a substantially circular pillar shape, a substantially elliptical pillar shape or a substantially polygonal pillar shape. Further, the first mask 410 may have various cross sectional shapes such as a substantially circular shape, a substantially elliptical shape or a substantially polygonal shape. The second mask 413 may have a line shape or a bar shape that extends on the semiconductor layer of the substrate 403 in a predetermined direction. In example embodiments of the inventive concept, a plurality of the first masks 410 may be formed in the first area A of the substrate 403, and a plurality of the second masks 413 may be formed in the second area B of the substrate 403.

A first preliminary active pattern 411 and a second preliminary active pattern 414 are formed on the first and the second areas A and B of the substrate 403, respectively. The first and the second preliminary active patterns 411 and 414 are formed by partially etching of the semiconductor layer of substrate 403 using the first and the second masks 410 and 413 as etching masks. For example, the first and the second preliminary active patterns 411 and 414 may be formed by an anisotropic etching process. In example embodiments of the inventive concept, a plurality of the first preliminary active patterns 411 may be formed in the first area A of the substrate 403, and a plurality of the second preliminary active patterns 414 may be formed in the second area B of the substrate 403. Here, the first preliminary active pattern 411 may have various pillar shapes such as a substantially circular pillar shape, a substantially elliptical pillar shape or a substantially polygonal pillar shape. Additionally, the first preliminary active pattern 411 may have various cross sectional shapes, such as a substantially circular shape, a substantially elliptical shape or a substantially polygonal shape depending on the cross sectional shape of the first mask 410. Furthermore, the second preliminary active pattern 414 may have a line shape or a bar shape depending on the shape of the second mask 413.

Figure 17B:
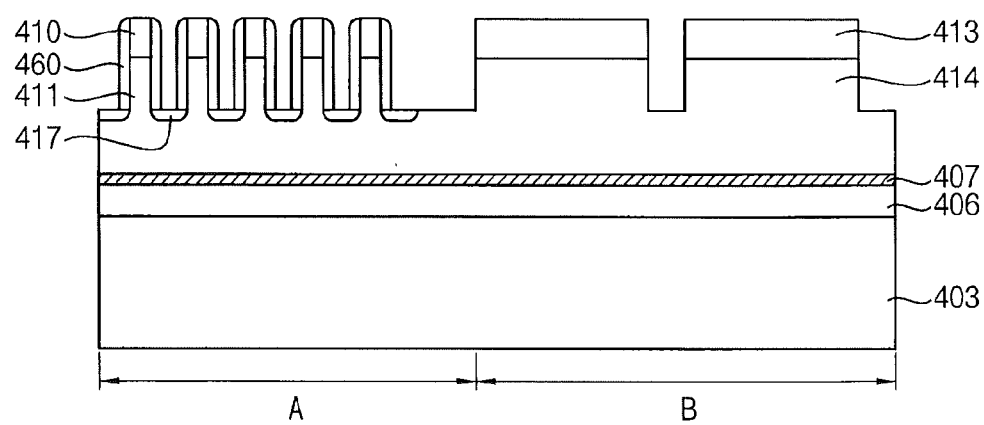

Referring to FIG. 17B, a spacer 460 is formed on a sidewall of the first preliminary active pattern 411 and the first mask 410. The spacer 460 may be formed using nitride, such as silicon nitride or oxynitride like silicon oxynitride.

A first preliminary impurity region 417 is formed by implanting first impurities into a portion of the semiconductor layer adjacent to the first preliminary active pattern 411. The first preliminary impurity region 417 may be formed at an exposed portion of the first area A of the substrate 403 between adjacent first preliminary active patterns 411. The first impurities may include P type impurities or N type impurities. For example, the first preliminary impurity region 417 may include the P type impurities, such as boron (B), indium (In), etc., or the N type impurities such as nitrogen (N), arsenic (As), etc. In example embodiments of the inventive concept, the first preliminary impurity region 417 may be electrically connected to a first wiring 408 (see FIG. 17C) formed in a subsequent process through an additional wiring, an additional contact, an additional plug, etc.

Figure 17C:
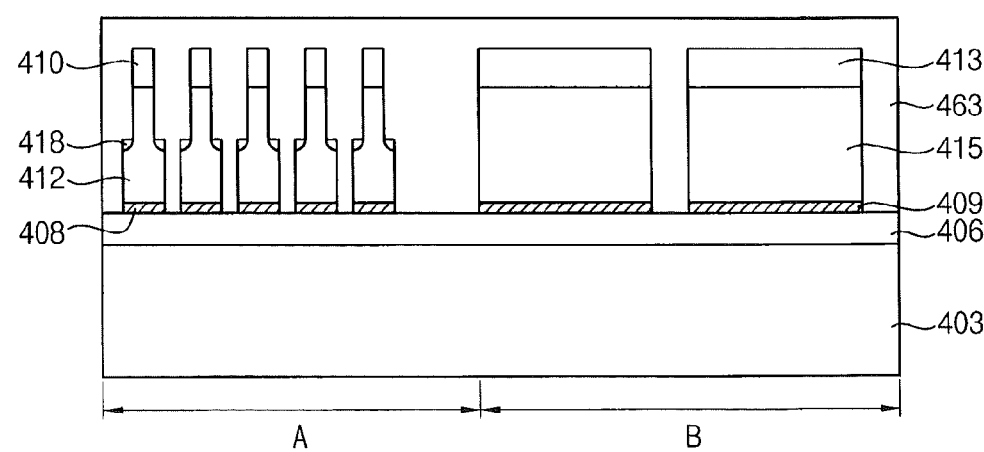

Referring to FIG. 17C, a first active pattern 412 and a second active pattern 415 are formed in the first and the second areas A and B of the substrate 403, respectively. The first and the second active patterns 412 and 415 are formed by etching a lower portion of the semiconductor layer using the first mask 410, the second mask 413 and the spacer 460 as etching masks. A lower portion of the first active pattern 412 may have a width substantially smaller than that of an upper portion thereof. A lower portion of the second active pattern 415 may have a width substantially the same as that of an upper portion thereof. That is, a step may occur between the lower portion and the upper portion of the first active pattern 412.

A first impurity region 418 is formed at a central portion of the first active pattern 412 by partially etching the first preliminary impurity region 417 in an etching process for forming the first and the second active patterns 412 and 415. The first impurity region 418 may serve as source/drain regions of a first transistor having a channel generated in a direction substantially perpendicular to the substrate 403.

By patterning the wiring layer 407 using the first and the second masks 410 and 413 as etching masks, the first wiring 408 is provided beneath the first active pattern 412 and a second wiring 409 is formed beneath the second active pattern 415. The first wiring 408 may have a width substantially the same as that of the lower portion of the first active pattern 412. The first wiring 408 may have a relatively low resistance to serve as a buried bit line that is electrically connected to the first impurity region 418. Hence, a resistance of the semiconductor device having the first wiring 408 may be reduced. Further, the second wiring 409 may have a width substantially the same as that of the lower portion of the second active pattern 415. The second wiring 409 may serve as a connection wiring in the second area B of the substrate 403.

Referring now to FIG. 17C, a first preliminary insulating interlayer 463 is formed in the first and the second areas A and B of the substrate 403. The first preliminary insulating interlayer 463 may cover the first and the second active patterns 412 and 415. The first preliminary insulating interlayer 463 may be formed using oxide such as silicon oxide.

Referring to 17D, a first insulating interlayer 416 is formed over the substrate 403 by partially removing the first preliminary insulating interlayer 463. The first insulating interlayer 416 may effectively fill a gap between lower portions of the first active patterns 412 in the first area A of the substrate 403. The first insulating interlayer 416 may expose an upper face of the second active pattern 415 in the second area B of the substrate 403. For example, the first insulating interlayer 416 may cover the lower portion of the first active pattern 412 and may expose the upper portion of the first active pattern 412. Further, the first impurity region 418 may be covered with the first insulating interlayer 416. Thus, an upper face of the first insulating interlayer 416 may have an upper face positioned between the lower portion of the first active pattern 412 and the upper portion of the first active pattern 412 in the first area A of the substrate 403. Meanwhile, the first insulating interlayer 416 may expose the second mask 413 on the second active pattern 415 in the second area B of the substrate 403. That is, the upper face of the first insulating interlayer 416 and an upper face of the second mask 413 may be positioned on the substantially same plane in the second area B of the substrate 403.

A first gate insulation layer 421 is formed on an upper sidewall of the first active pattern 412 exposed by the first insulating interlayer 416. The first gate insulation layer 421 may electrically insulate the first active pattern 412 from a first gate electrode 424 formed in a subsequent process. The first gate insulation layer 421 may enclose the upper sidewall of the first active pattern 412. The first gate insulation layer 421 may be formed using silicon oxide and/or metal oxide.

A conductive layer (not illustrated) is formed on the first insulating interlayer 416 to cover the first active pattern 412. The conductive layer may be formed using polysilicon doped with impurities, metal and/or metal compound. A third mask (not illustrated) is formed on the conductive layer, and then the conductive layer is partially etched using the third mask as an etching mask. Hence, the first gate electrode 424 is provided on the first insulating interlayer 416. The first gate electrode 424 may enclose the upper sidewall of the first active pattern 412. Additionally, the first gate electrode 424 may have a height substantially lower than that of the first active pattern 412. Thus, the upper portion of the first active pattern 412 may be partially exposed over the first gate electrode 424.

An upper face of the first active pattern 412 is exposed by removing the first mask 411 in the first area A of the substrate 403. Here, the second mask 413 in the second area B of the substrate 403 may not be removed.

A second impurity region 427 is formed at the upper portion of the first active pattern 412 by implanting second impurities into the upper portion of the exposed first active pattern 412. The second impurity region 427 may serve as other source/drain regions of the first transistor. For example, the second impurities may include P type impurities or N type impurities. The second impurities of the second impurity region 427 may be substantially the same as or substantially similar to the first impurities in the first impurity region 418.

When the second impurity region 427 is formed, the first transistor including the first active pattern 412, the first gate insulation layer 421, the gate electrode 424, the first impurity region 418, and the second impurity region 427 is provided in the first area A of the substrate 403. The first transistor may include the first and the second impurity regions 418 and 427 positioned adjacent to the lower and the upper portions of the first gate electrode 424, respectively.

After exposing the second active pattern 415 by removing the second mask 413 in the second region B of the substrate 403, a second gate insulation layer 430, a second gate electrode 433, and a gate mask 436 are sequentially formed on the exposed second active pattern 415. The second gate insulation layer 430 may be formed using silicon oxide and/or metal oxide, and the second gate electrode 433 may be formed using polysilicon doped with impurities, metal and/or metal compound. Further, the gate mask 436 may be formed using a material having an etching selectivity with respect to the first insulating interlayer 416 and the second active pattern 415 such as silicon nitride, silicon oxynitride, etc.

Figure 17D:
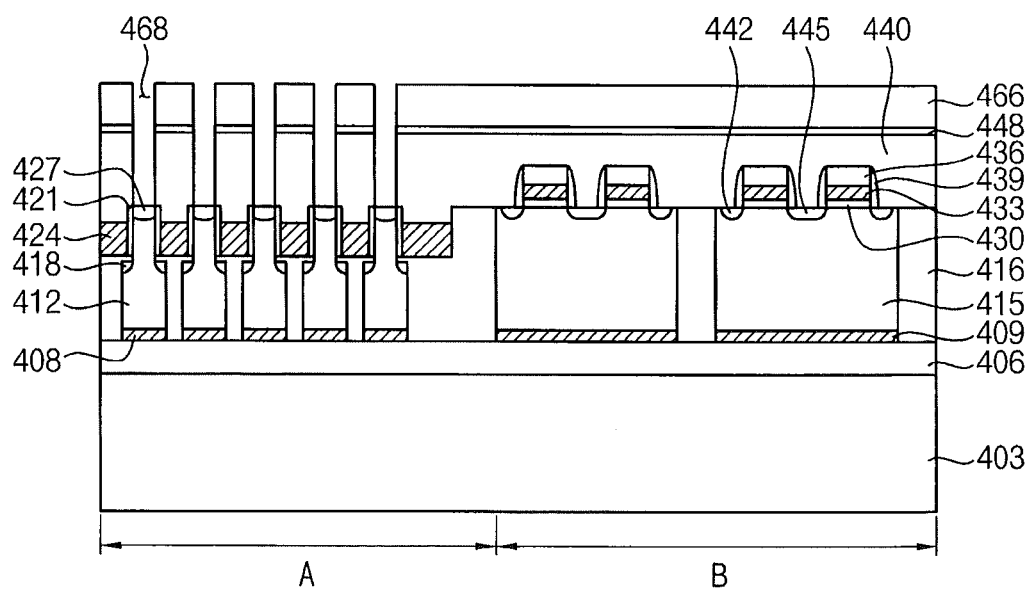

Referring to FIG. 17D, a gate spacer 439 is formed on sidewalls of the gate mask 436 and the second gate electrode 433. The gate spacer 439 may be formed using nitride, such as silicon nitride, or oxynitride like silicon oxynitride.

A third impurity region 442 and a fourth impurity region 445 are formed at portions of the second active pattern 415 by implanting third impurities into the portions of the second active pattern 415 adjacent to the second gate electrode 433 using the second gate electrode 433 and the gate spacer 439 as implantation masks. The third and the fourth impurity regions 442 and 445 may be formed adjacent to both sides of the second gate electrode 433, respectively. Therefore, a second transistor having the second gate insulation layer 430, the second gate electrode 433, and the third and fourth impurity regions 442 and 445 is formed in the second area B of the substrate 403.

After forming a second insulating interlayer 440 on the first insulating interlayer 416, an etch-stop layer 448 and a sacrificial layer 466 are sequentially formed on the second insulating interlayer 440. The sacrificial layer 466, the etch-stop layer 448 and the second insulating interlayer 440 are partially etched, so that an opening 468 is formed through sacrificial layer 466, the etch-stop layer 448, and the second insulating interlayer 440. The opening 468 exposes the second impurity region 427 formed on the first active pattern 412. Processes for forming the etch-stop layer 448, the sacrificial layer 466, and the opening 468 may be substantially the same as or substantially similar to the above-described processes according to various example embodiments of the inventive concept.

A first conductive pattern (not illustrated) and a second conductive pattern (not illustrated) are formed to fill the opening 468. A third conductive pattern is formed on the second conductive pattern, thereby providing an electrode structure having a construction substantially the same as or substantially similar to the electrode structure described with reference to FIG. 16.

A dielectric layer and an upper electrode are sequentially formed to cover the electrode structure, and thus the semiconductor device including a capacitor is formed on the substrate 403.

According to example embodiments of the inventive concept, a capacitor may have an electrode structure include a metal pattern and a metal oxide pattern without an additional photolithography process. Thus, the capacitor having the electrode structure may ensure a high integration degree through simplified processes while reducing manufacturing cost and time for a semiconductor device including the capacitor. For example, a first conductive pattern including metal may be integrally formed with a second conductive pattern including metal oxide, so that each of the electrode structure and the capacitor may have enhanced structural stability when the electrode structure and/or the capacitor has a considerably high aspect ratio. Additionally, the capacitor including the electrode structure may have a greatly effective area because a third conductive pattern including various conductive materials may be additionally provided on the second conductive pattern. Therefore, the capacitor and/or the semiconductor device may have greatly improved storage capacity and integration degree. Furthermore, the resistance of the second conductive pattern of the electrode structure may be properly adjusted, so that the capacitor and the semiconductor device may ensure desired electrical characteristics.

Figure 18:
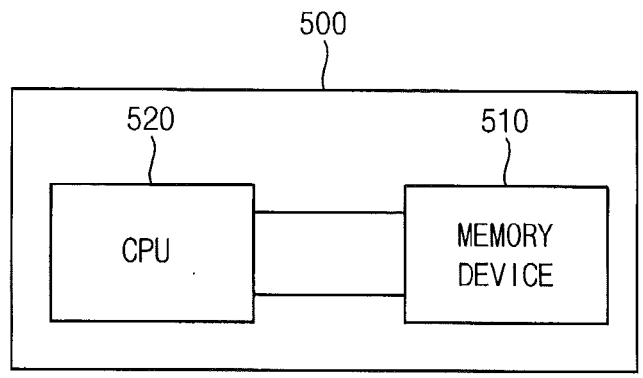

FIG. 18 is a block diagram illustrating a memory system having a memory device that includes a capacitor with an electrode structure in accordance with example embodiments of the inventive concept.

Referring to FIG. 18, a memory device 510 may be electrically connected to a central processing unit (CPU) 520 in a memory system 500. The memory system 500 may include a personal computer, a personal digital assistant (PDA) device, etc. The memory device 510 may be directly connected to the CPU 520, or indirectly connected to the CPU 510 via buses.

The memory device 510 may include a capacitor including an electrode structure in accordance with the above-described example embodiments of the inventive concept. Thus, the memory device 510 may have a high storage capacity and improved electrical characteristics, and the memory system 500 including the memory device 510 may have improved performance.

Figure 19:
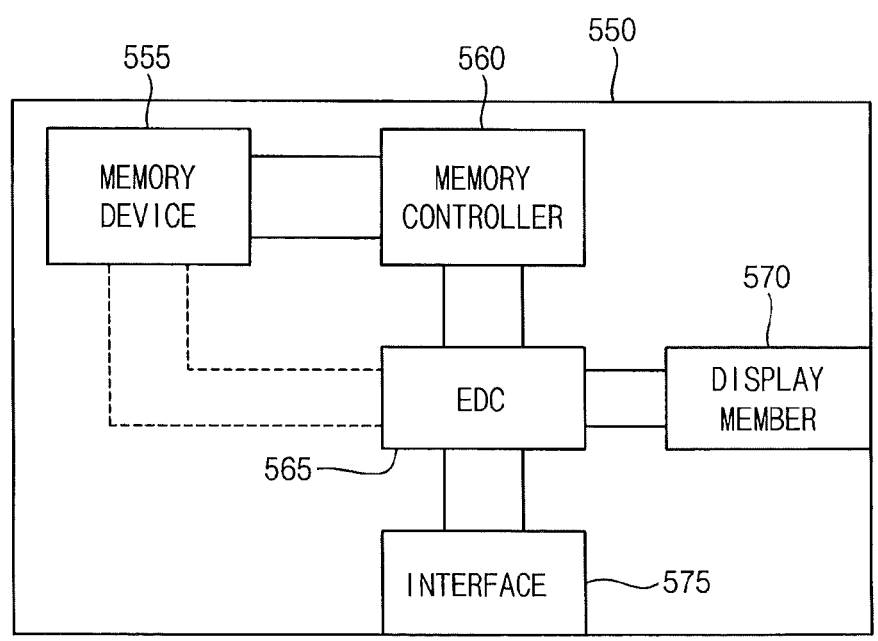

FIG. 19 is a block diagram illustrating a memory system having a memory device that includes a capacitor with an electrode structure in accordance with example embodiments of the inventive concept.

Referring to FIG. 19, a memory system 550 may include a portable electronic device. For example, the memory system 550 may be a portable media player (PMP), a wireless communication device, an MP3 player, an electronic dictionary, etc. The memory system 550 may have a semiconductor memory device 555, a memory controller 560, an encoder/decoder (EDC) 565, a display member 570, and an interface 575. The memory device 555 may include an electrode structure in accordance with the above-described example embodiments of the inventive concept.

The EDC 565 may store data, such as audio data and/or video data into the memory device 555 through the memory controller 560. Additionally, the data may be output from the memory device 555 by the ECD 565 through the memory controller 560. Alternatively, the data may be directly stored into the memory device 555 from the ECD 565, and the data may be directly output from the memory device 555 into the ECD 565.

The EDC 565 may encode data to be stored in the memory device 555. For example, the EDC 565 may execute encoding for storing audio data and/or video data into the memory device 555 of a PMP or an MP3 player. Further, the EDC 565 may execute MPEG encoding for storing video data in the memory device 555. The EDC 565 may include multiple encoders to encode different types of data depending on their formats. For example, the EDC 565 may include an MP3 encoder for encoding audio data and an MPEG encoder for encoding video data.

The EDC 565 may also decode data output from the memory device 555. For example, the EDC 565 may decode MP3 audio data from the memory device 555. Further, the EDC 565 may decode MPEG video data from the memory device 555. The EDC 565 may include multiple decoders to decode different types of data depending on their formats. For example, the EDC 565 may include an MP3 decoder for audio data and an MPEG decoder for video data.

The EDC 565 may include an MP3 decoder for the audio data and an MPEG decoder for the video data. Alternatively, the EDC 565 may include a decoder for the audio data and/or the video data only. For example, encoded audio/video data may be input to the EDC 565, and then the EDC 565 may decode the input data and transfer the decoded data to the memory controller 560 an/or the memory device 555.

The EDC 565 may receive the encoded audio/video data or audio/video data being encoded via the interface 575. The interface 575 may be compliant with standard input devices, e.g. Fire Wire or USB. That is, the interface 575 may include a Fire Wire interface, a USB interface or the like. Data may be output from the memory device 555 by way of the interface 575.

The display member 570 may display to an end-user data output from the memory device 555 and decoded by the EDC 565. For example, the display member 570 may be an audio speaker or a display screen.

The memory device 555 according to example embodiments of the inventive concept may be highly integrated and may have a high storage capacity, while providing excellent electrical characteristics. Thus, the memory system 550 including the memory device 555 may have improved performance.

The foregoing is illustrative of example embodiments of the inventive concept and is not to be construed as limiting thereof. Although a few example embodiments of the inventive concept have been described, those skilled in the art will readily appreciate that many modifications are possible in the example embodiments of the inventive concept without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments of the inventive concept and is not to be construed as limited to the specific example embodiments of the inventive concept disclosed, and that modifications to the disclosed example embodiments of the inventive concept, as well as other example embodiments of the inventive concept, are intended to be included within the scope of the appended claims.

That which is claimed:

1. A method of manufacturing a capacitor, comprising:
   forming an insulation layer on a substrate;
   forming a first conductive pattern including metal buried in the insulation layer;
   forming a second conductive pattern including metal oxide generated from the first conductive pattern;
   forming a third conductive pattern on the second conductive pattern;
   forming a dielectric layer on the second and the third conductive patterns; and
   forming an upper electrode on the dielectric layer;
   forming a first sacrificial layer on the insulation layer before forming the second conductive pattern;
   forming a second sacrificial layer on the first sacrificial layer to cover the second conductive pattern;
   forming an opening by etching the second sacrificial layer, the opening exposing the second conductive pattern; and
   forming a third conductive pattern on the second conductive pattern and a sidewall of the opening.

2. The method of claim 1, wherein forming the third conductive pattern further comprises forming a supporting member between adjacent elements of the third conductive patterns.

* * * * *